United States Patent
Kim et al.

(10) Patent No.: US 12,426,156 B2
(45) Date of Patent: Sep. 23, 2025

(54) MEMBER FOR WINDOW MODULE AND METHOD OF MANUFACTURING WINDOW MODULE USING THE SAME

(71) Applicant: Samsung Display Co., Ltd., Yongin-si (KR)

(72) Inventors: Sunghoon Kim, Asan-si (KR); Byunghoon Kang, Seoul (KR); Kyung-Man Kim, Anyang-si (KR); Sanghoon Kim, Hwaseong-si (KR); Seungho Kim, Asan-si (KR); Yuri Kim, Guri-si (KR); Min-Hoon Choi, Seoul (KR); Seongjin Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 372 days.

(21) Appl. No.: 17/873,499

(22) Filed: Jul. 26, 2022

(65) Prior Publication Data

US 2023/0124699 A1 Apr. 20, 2023

(30) Foreign Application Priority Data

Oct. 14, 2021 (KR) .......................... 10-2021-0136441

(51) Int. Cl.
*H05K 1/02* (2006.01)
*H05K 1/18* (2006.01)
*G09F 9/30* (2006.01)

(52) U.S. Cl.
CPC ......... *H05K 1/0281* (2013.01); *H05K 1/0278* (2013.01); *H05K 1/189* (2013.01); *G09F 9/301* (2013.01); *H05K 2201/10128* (2013.01)

(58) Field of Classification Search
CPC .... H05K 1/0281; H05K 1/0278; H05K 1/189; H05K 2201/10128; G09F 9/301
USPC .......................................................... 361/749
See application file for complete search history.

(56) References Cited

U.S. PATENT DOCUMENTS

| 9,354,476 | B2 | 5/2016 | Han et al. |
| 10,020,462 | B1 | 7/2018 | Ai et al. |
| 2015/0043174 | A1* | 2/2015 | Han ................... G02F 1/13452 |
| | | | 428/156 |
| 2017/0135239 | A1* | 5/2017 | Hyun ................... H04M 1/236 |
| 2019/0181068 | A1* | 6/2019 | Funakawa ............... H05K 3/36 |
| 2019/0302850 | A1* | 10/2019 | Park .................... H04M 1/0268 |
| 2020/0328375 | A1* | 10/2020 | Won ....................... H10K 59/60 |

FOREIGN PATENT DOCUMENTS

| KR | 1020150017819 A | 2/2015 |
| KR | 1020180079093 A | 7/2018 |
| KR | 102068685 B1 | 1/2020 |
| KR | 102146730 B1 | 8/2020 |

* cited by examiner

*Primary Examiner* — Andargie M Aychillhum
(74) *Attorney, Agent, or Firm* — CANTOR COLBURN LLP

(57) ABSTRACT

A member for a window module includes a base layer which is foldable and in which a groove defined. The base layer includes a first dam structure in which the groove is defined. The member further includes a filler filled in the groove.

11 Claims, 21 Drawing Sheets

FIG. 14
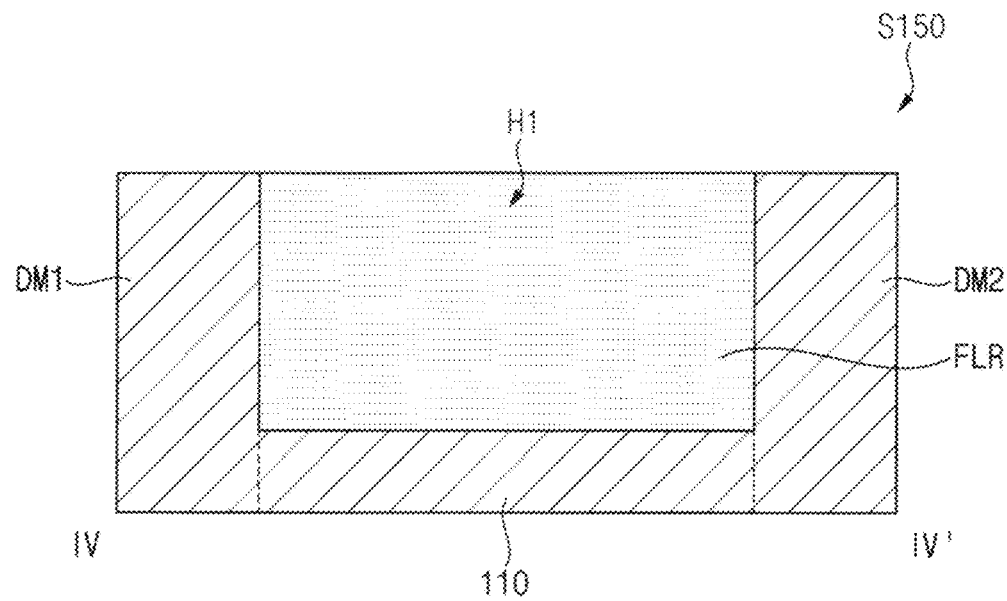
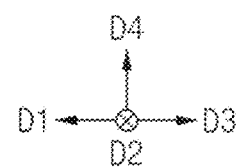
FIG. 15
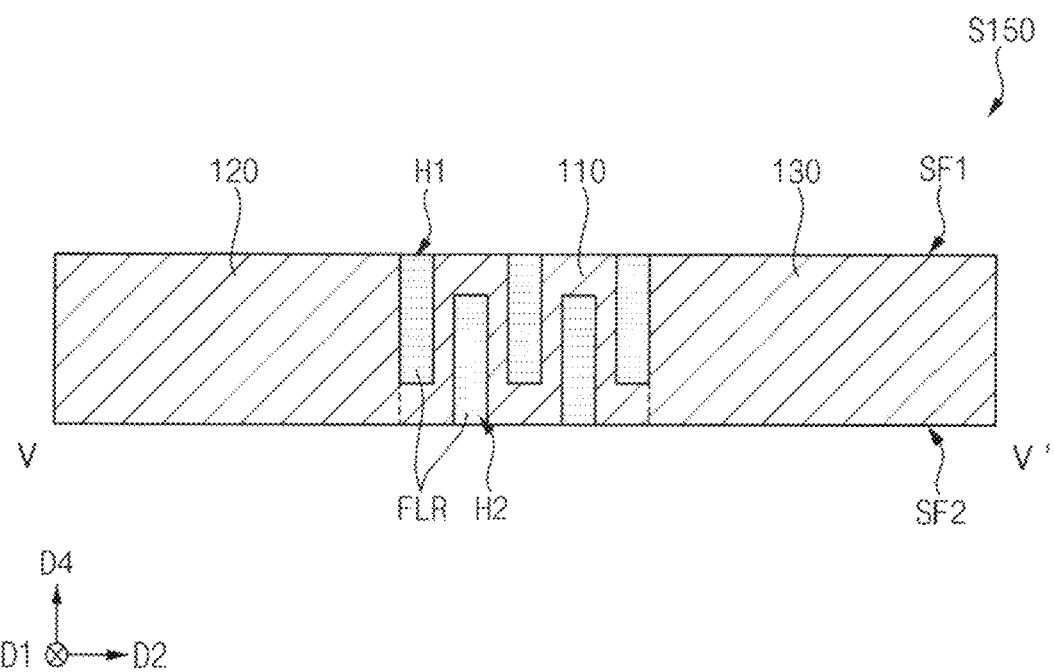

MEMBER FOR WINDOW MODULE AND METHOD OF MANUFACTURING WINDOW MODULE USING THE SAME

This application claims priority to Korean Patent Application No. 10-2021-0136441, filed on Oct. 14, 2021, and all the benefits accruing therefrom under 35 U.S.C. § 119, the content of which in its entirety is herein incorporated by reference.

BACKGROUND

1. Field

Embodiments of the invention relate generally to a member for a window module and a method of manufacturing a window module using the member.

2. Description of the Related Art

A flat panel display (e.g., an organic light-emitting display) has advantages such as a light weight and a thin thickness. By using the above advantages, a development of flexible display devices having flexible characteristics increases. The flexible display device includes a curved display device, a bent display device, a foldable display device, a rollable display device, a stretchable display device, and the like, for example. The flexible display device includes a display module and a window disposed on the display module. As grooves are defined in the window, the window may be smoothly folded.

SUMMARY

Embodiments provide a member for window module for manufacturing a window module.

Embodiments provide a method of manufacturing a window module, using the member for the window module.

In an embodiment of the invention, a member for a window module includes a base layer which is foldable and in which a groove is defined. The base layer includes a first dam structure defining a first inner side of the groove. The member further includes a filler filled in the groove.

In an embodiment, the filler may be accommodated by the groove and the first dam structure.

In an embodiment, the filler may define first inner sides of the first dam structure.

In an embodiment, the groove may extend in a first direction, and the first dam structure may be adjacent to the groove in the first direction.

In an embodiment, the groove may include a plurality of first grooves arranged in a second direction crossing the first direction, and the first dam structure may define first inner sides of the plurality of first grooves.

In an embodiment, the member may further include a second dam structure facing the first dam structure with the plurality of first grooves interposed therebetween.

In an embodiment, the second dam structure may be adjacent to the plurality of first grooves in a third direction opposite to the first direction, and the second dam structure may define second inner sides of the plurality of first grooves opposite to the first inner sides of the plurality of first grooves.

In an embodiment, the grooves may further include a plurality of second grooves alternately arranged with the plurality of first grooves and arranged in the second direction, the plurality of first grooves may be defined in a first surface of the base layer, and the plurality of second grooves may be defined in a second surface opposite to the first surface of the base layer.

In an embodiment, the first dam structure may further define inner sides of the plurality of second grooves.

In an embodiment, the base layer may further include a flat portion defining a second inner side of the groove, the groove may extend in a first direction, the first dam structure may be adjacent to the groove in the first direction, and the flat portion may be adjacent to the groove in a second direction crossing the first direction.

In an embodiment, the filler may be accommodated by the groove, the first dam structure, and the flat portion.

In an embodiment, a refractive index of the base layer may be equal to a refractive index of the filler.

In an embodiment of the invention, a method of manufacturing a window module includes defining a groove and forming a first dam structure defining an inner surface of the groove in a base layer, and filling the groove with a filler.

In an embodiment, the method may further include removing the first dam structure, after the filler is filled.

In an embodiment, the removing the first dam structure may include irradiating an intense light to a boundary between the groove and the first dam structure, and etching the first dam structure by reacting an etchant with an area irradiated with the intense light.

In an embodiment, the first dam structure may be removed by irradiating an etching intense light to a boundary between the groove and the first dam structure.

In an embodiment, the defining the groove and the first dam structure may include irradiating an intense light to the base layer, and etching the base layer by reacting an etchant with an area which is irradiated with the intense light.

In an embodiment, the groove may extend in a first direction, the first dam structure may be adjacent to the groove in the first direction, and the intense light may not be irradiated by a first width in the first direction of the first dam structure.

In an embodiment, the method may further include forming a second dam structure in the base layer, where the second dam structure faces the first dam structure with the groove interposed therebetween, and the intense light may not be irradiated by a second width in the first direction of the second dam structure.

Therefore, a member for a window module in embodiments of the invention may include a base layer including a dam structure and a filler. At least one groove may be defined in the base layer, and an accommodation space may be defined by the groove and the dam structure. The filler may not leak by the dam structure. In other words, the filler may be completely filled in the accommodating space, and an unfilled space may not occur in the accommodating space. Accordingly, the window module manufactured as the member for the window module may improve the display quality of the display device.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIGS. 14 and 15 are cross-sectional views illustrating a fifth operation included in the method of FIG. 2.

DETAILED DESCRIPTION

Figure 1:
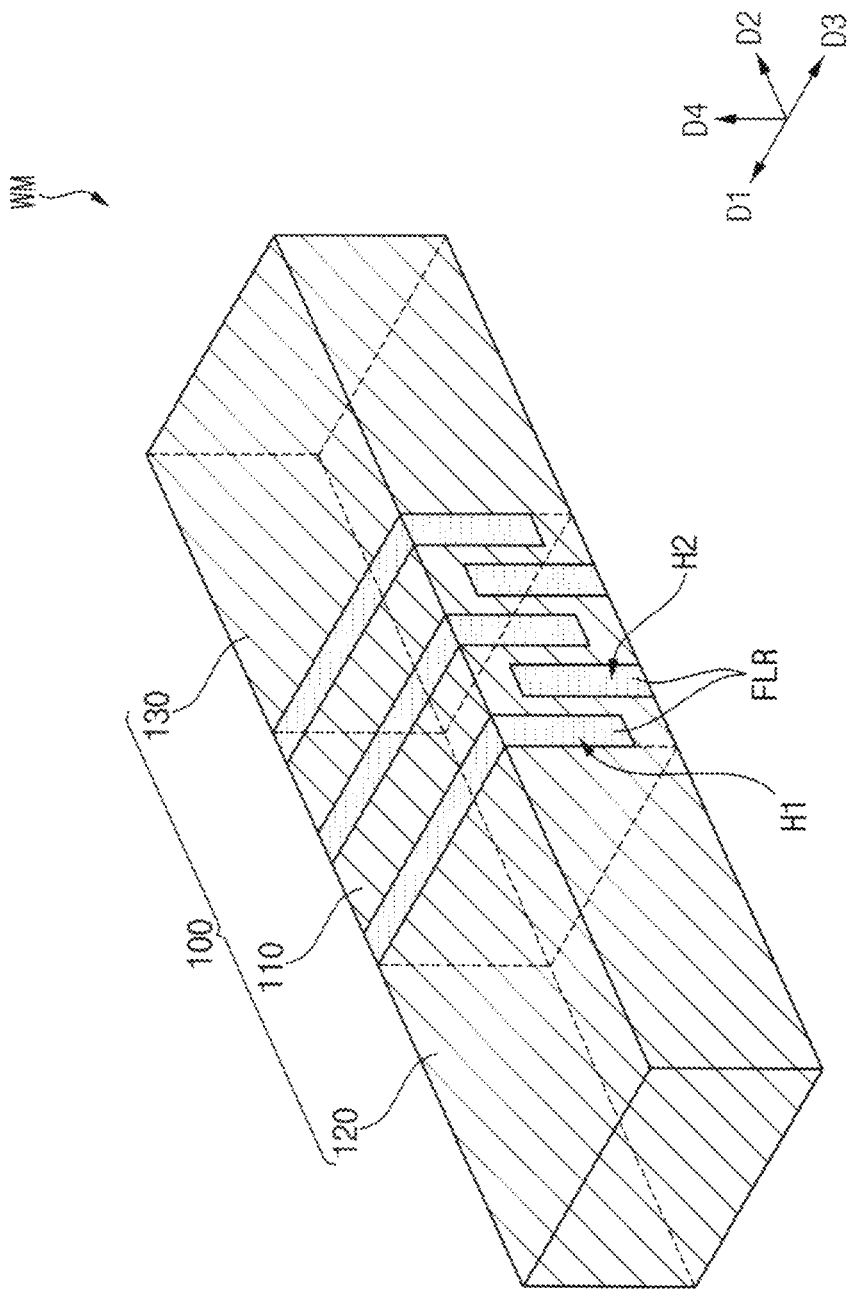
FIG. 1 is a perspective view illustrating an embodiment of a window module manufactured using a member for a window module.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a perspective view illustrating an embodiment of a window module manufactured using a member for a window module.

Figure 13:
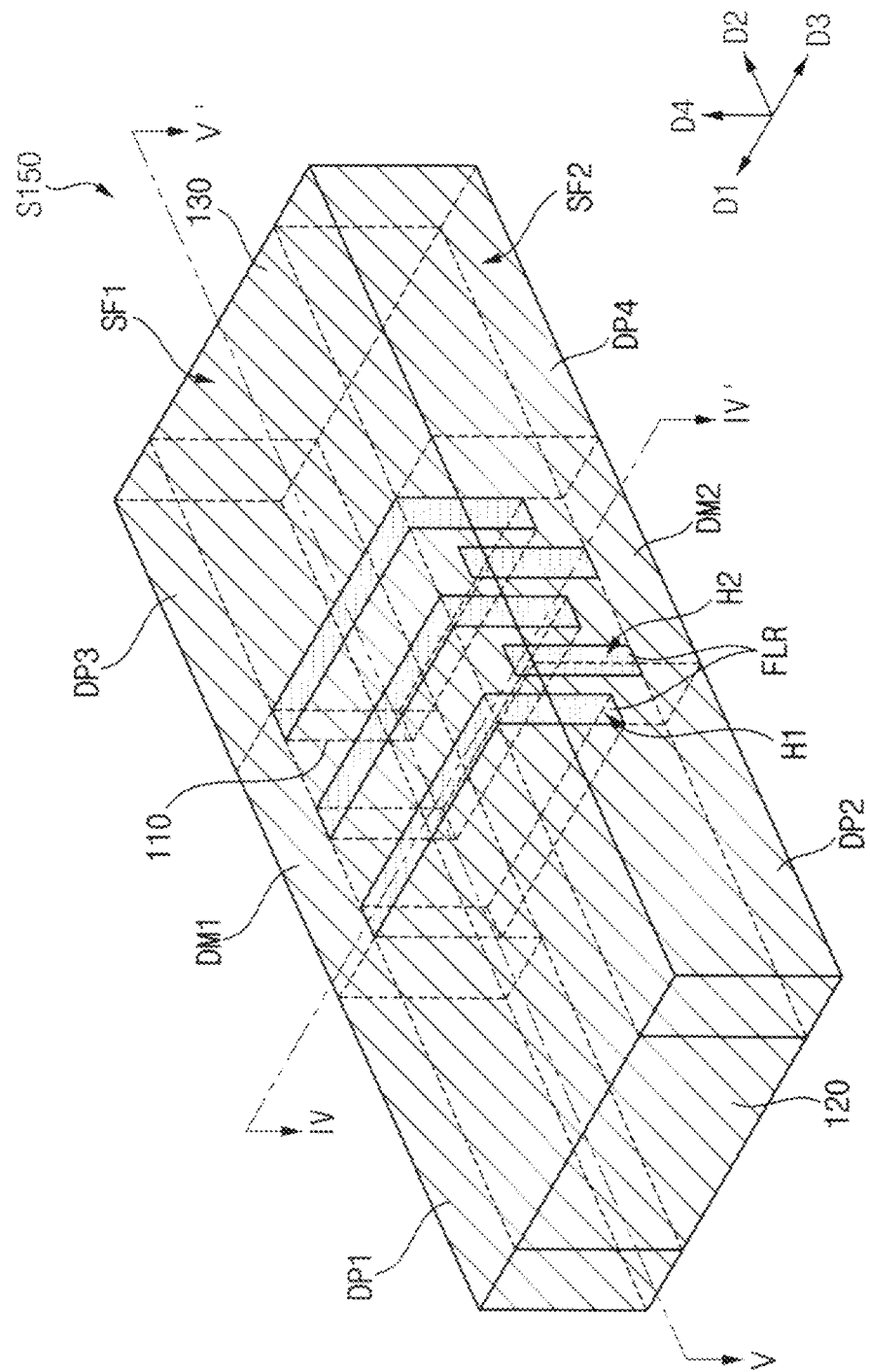
FIG. 13 is a perspective view illustrating a fifth operation included in the method of FIG. 2.

Referring to FIG. 1, a window module WM manufactured using a member (e.g. a member (also referred to as a window module member) 100M in FIG. 13) for a window module in an embodiment of the invention may include a base layer 100 and a filler FLR.

The base layer 100 may include a folding portion 110, a first flat portion 120, and a second flat portion 130.

In an embodiment, the base layer 100 may include a rigid material. In an embodiment, the base layer 100 may be glass or ultra-thin glass ("UTG"), for example. In embodiments, materials that may be used as the glass may include soda lime glass, alkali aluminosilicate glass, borosilicate glass, lithium alumina silicate glass, or the like. These may be used alone or in combination with each other.

In an embodiment, the base layer 100 may include a soft material. In an embodiment, the base layer 100 may be plastic, for example. In embodiments, materials that may be used as the plastic may include polyimide ("PI"), polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), or the like. These may be used alone or in combination with each other.

At least one groove may be defined in the folding portion 110. In an embodiment, a plurality of first grooves H1 may be defined in a top surface of the folding portion 110, and a plurality of second grooves H2 may be defined in a rear surface of the folding portion 110, for example. The first grooves H1 may extend in a predetermined direction, e.g., a first direction D1 and/or a third direction D3, and may be arranged in a second direction D2 crossing the first and third direction D1 and D3. The second grooves H2 may extend in the predetermined direction, e.g., the first direction D1 and/or the third direction D3, and may be arranged in the second direction D2. The second grooves H2 may be alternately arranged with the first grooves H1.

In an embodiment, the filler FLR may be filled in the first grooves H1 and the second grooves H2. The filler FLR may include a soft material. In an embodiment, the filler FLR may be a resin, for example. In an embodiment, the filler FLR may be a resin having a small modulus, for example. In addition, in an embodiment, the filler FLR may be a resin having the same refractive index as a refractive index of the base layer 100. Accordingly, the base layer 100 and the filler FLR may be index-matched.

As the base layer 100 includes the rigid material, hardness of the base layer 100 may increase. In addition, as the first grooves H1 and the second grooves H2 are defined in opposite surfaces of the folding portion 110 and the filler FLR has a low modulus, the folding portion 110 smoothly may be folded. In addition, as the refractive index of the filler FLR is the same as the refractive index of the base layer 100, the display quality in the folding portion 110 may be improved.

Figure 2:
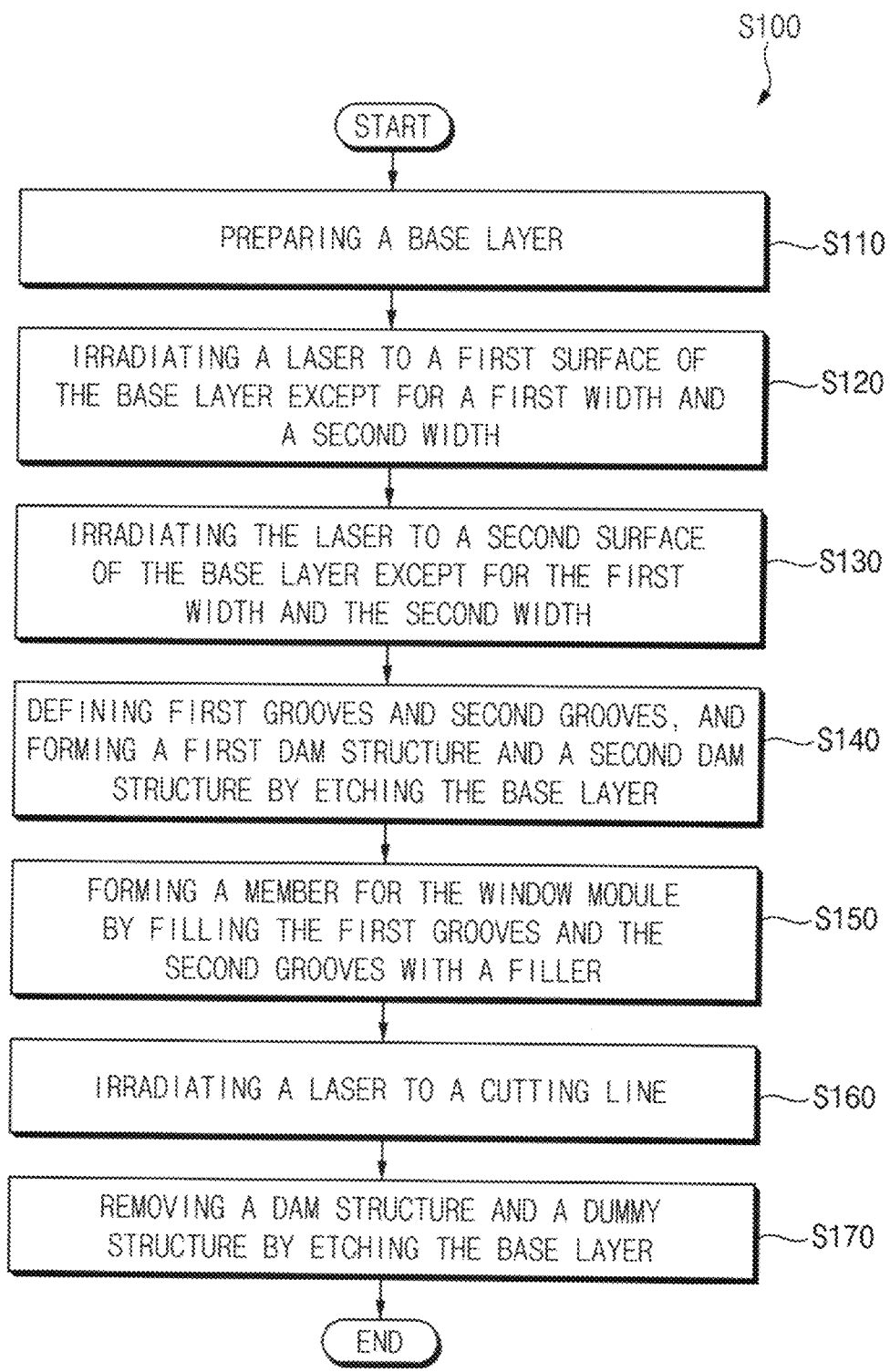
FIG. 2 is a flowchart illustrating an embodiment of a method of manufacturing the window module of FIG. 1.

FIG. 2 is a flowchart illustrating an embodiment of a method of manufacturing the window module of FIG. 1.

Referring to FIG. 2, an embodiment of the method S100 of manufacturing the window module WM may include first to seventh operations S110, S120, S130, S140, S150, S160, and S170. Hereinafter, it will be described.

Figure 3:
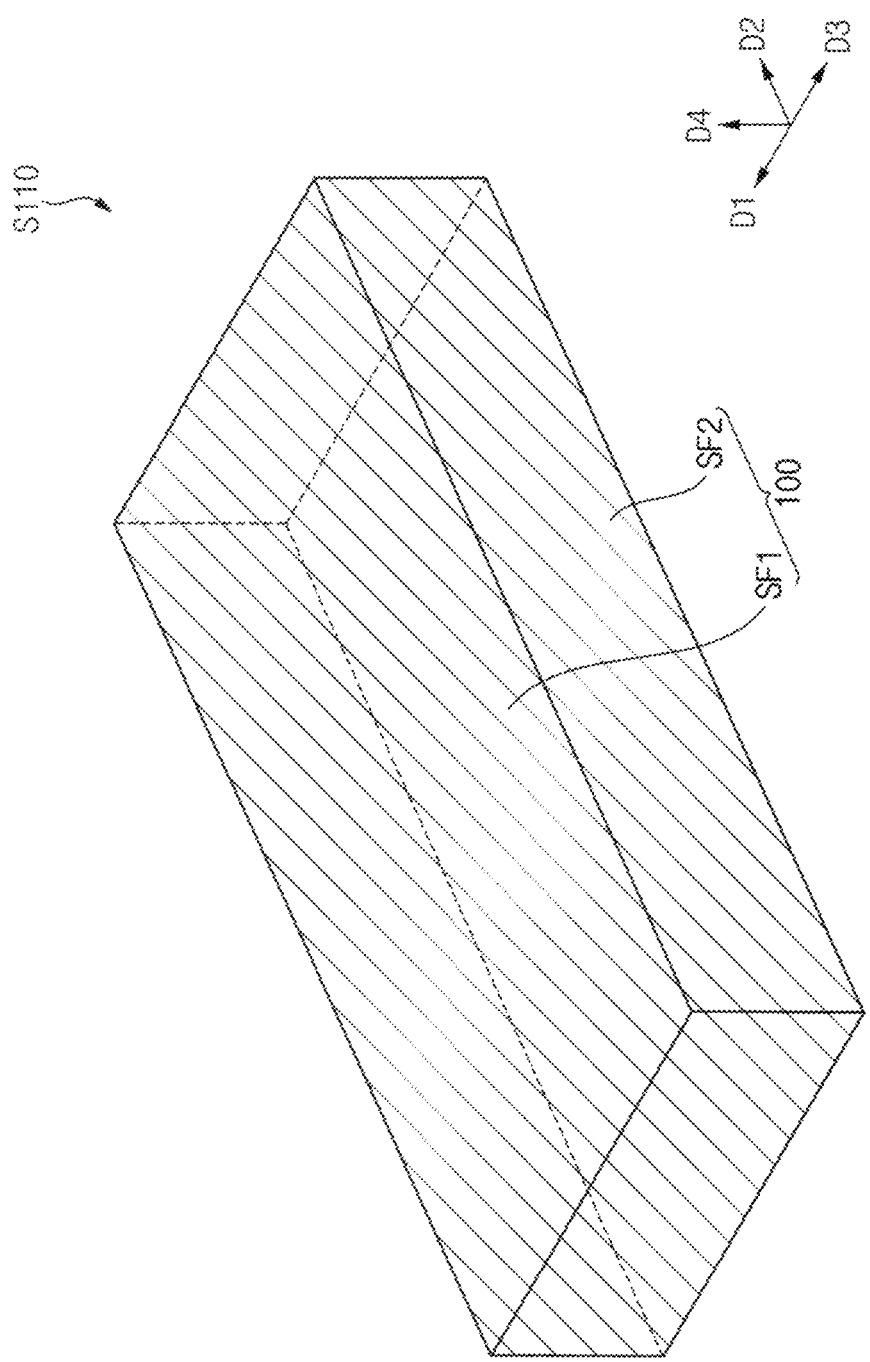
FIG. 3 is a perspective view illustrating a first operation included in the method of FIG. 2.

FIG. 3 is a perspective view illustrating a first operation included in the method of FIG. 2.

Referring to FIG. 3, the base layer 100 may be prepared (S110). The base layer 100 may include a first surface SF1 and a second surface SF2. The first surface SF1 may correspond to the top surface of the base layer 100. The second surface SF2 may be opposite to the first surface SF1 and may correspond to the rear surface of the base layer 100.

Figure 4:
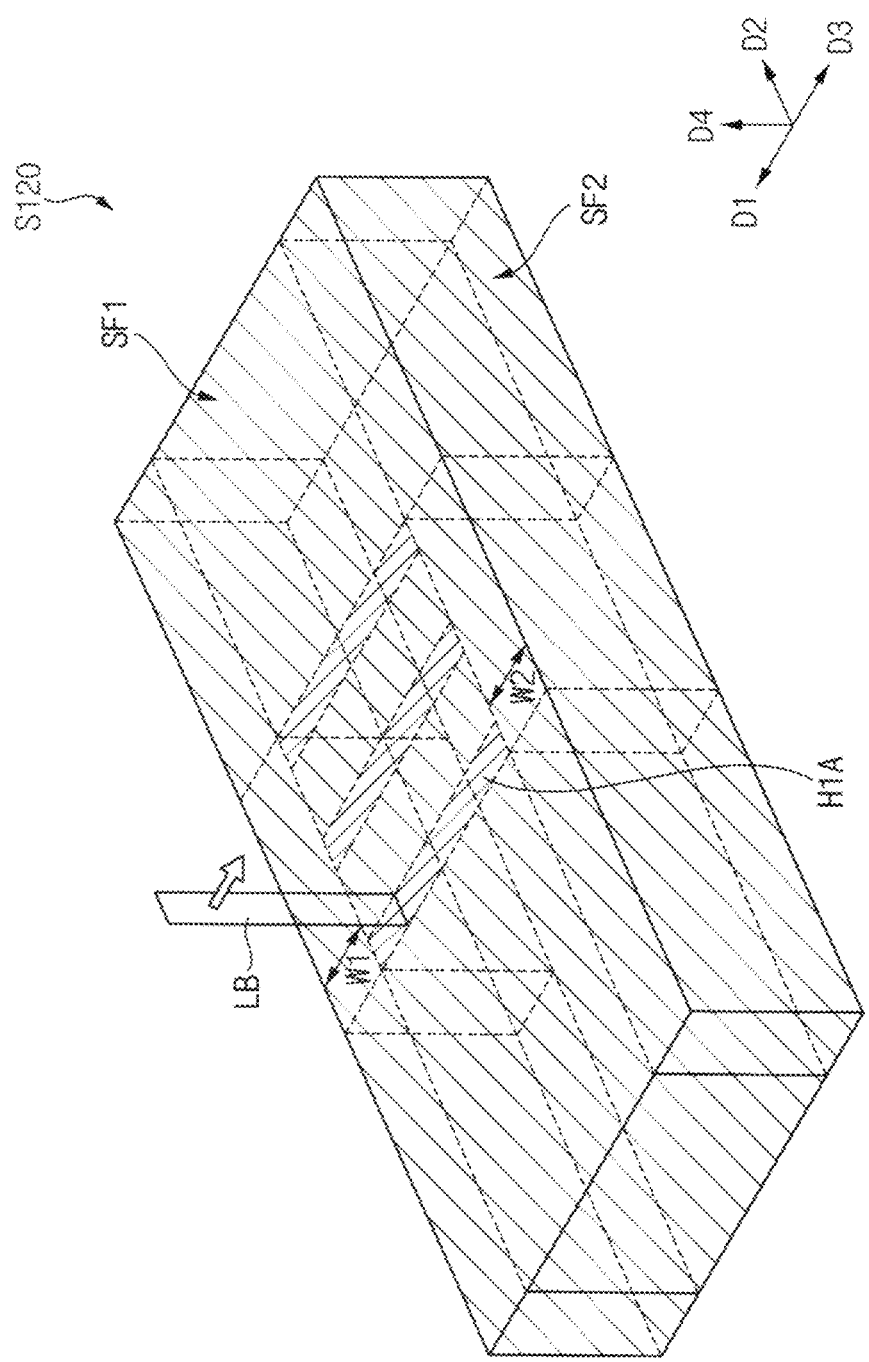
FIG. 4 is a perspective view illustrating a second operation included in the method of FIG. 2.
Figure 5:
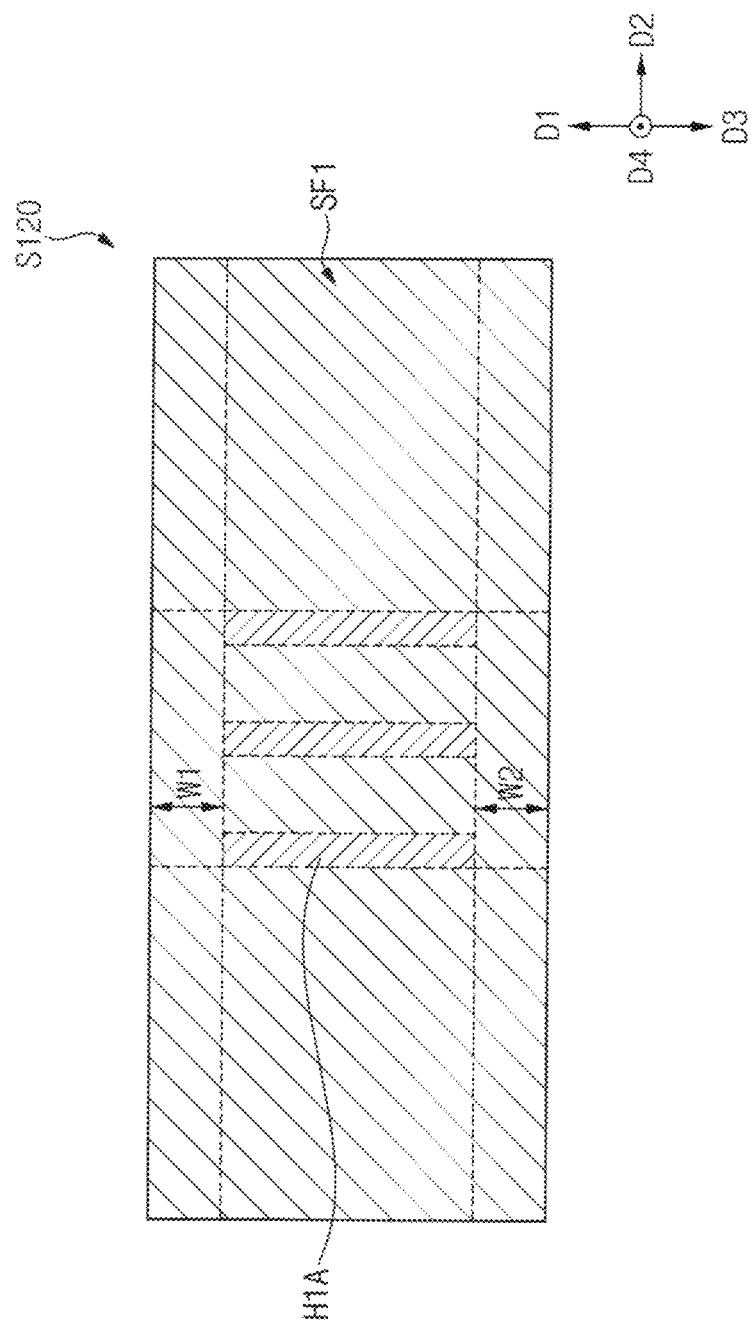
FIG. 5 is a plan view illustrating a second operation included in the method of FIG. 2.

FIG. 4 is a perspective view illustrating a second operation included in the method of FIG. 2. FIG. 5 is a plan view illustrating a second operation included in the method of FIG. 2.

Referring to FIGS. 4 and 5, an intense light, e.g., a laser LB, may be irradiated to a first hole area H1A of the base layer 100 (S120).

In an embodiment, the first hole area H1A may be defined in the first surface SF1 and may be an area in which the first grooves H1 are defined. In addition, the first hole area H1A may be an area including opposite sides spaced apart from opposite sides of the first surface SF1 respectively by the first width W1 and the second width W2 in the first surface SF1 in the first direction D1 and the third direction D3. The first width W1 may be a width in which a first dam structure (e.g., a first dam structure DM1 in FIG. 8) extends in the first direction D1. The second width W2 may be a width in which a second dam structure (e.g., a second dam structure DM2 in FIG. 8) extends in the third direction D3.

In other words, the laser LB may be transmitted in the predetermined direction, e.g., the first direction D1 and/or third direction D3, and may be irradiated to the first surface SF1 except for the first width W1 and the second width W2. As the laser LB is irradiated to the first hole area H1A, the first hole area H1A may have an etch selectivity different from an etch selectivity of an area to which the laser LB is not irradiated.

Figure 6:
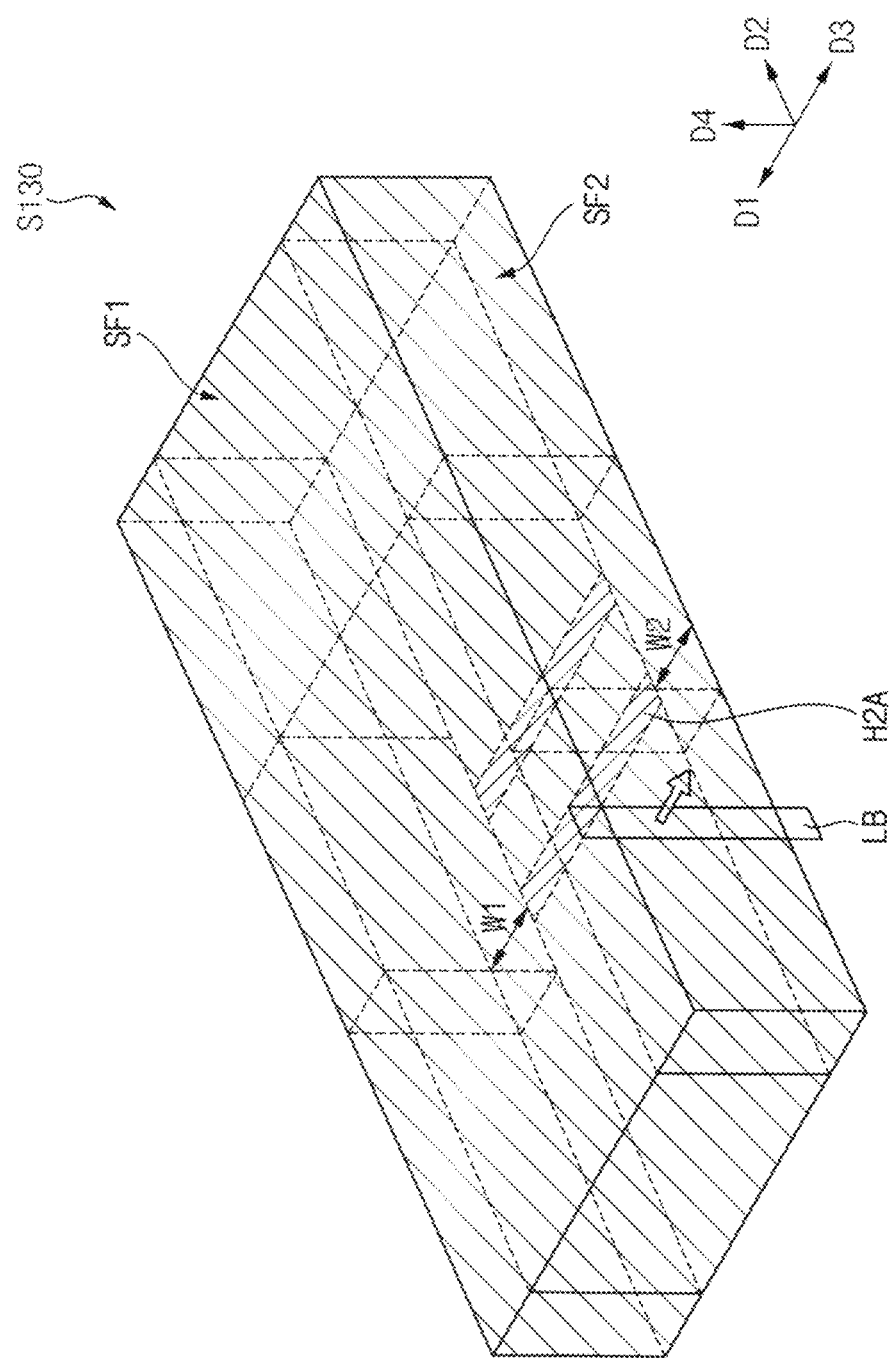
FIG. 6 is a perspective view illustrating a third operation included in the method of FIG. 2.
Figure 7:
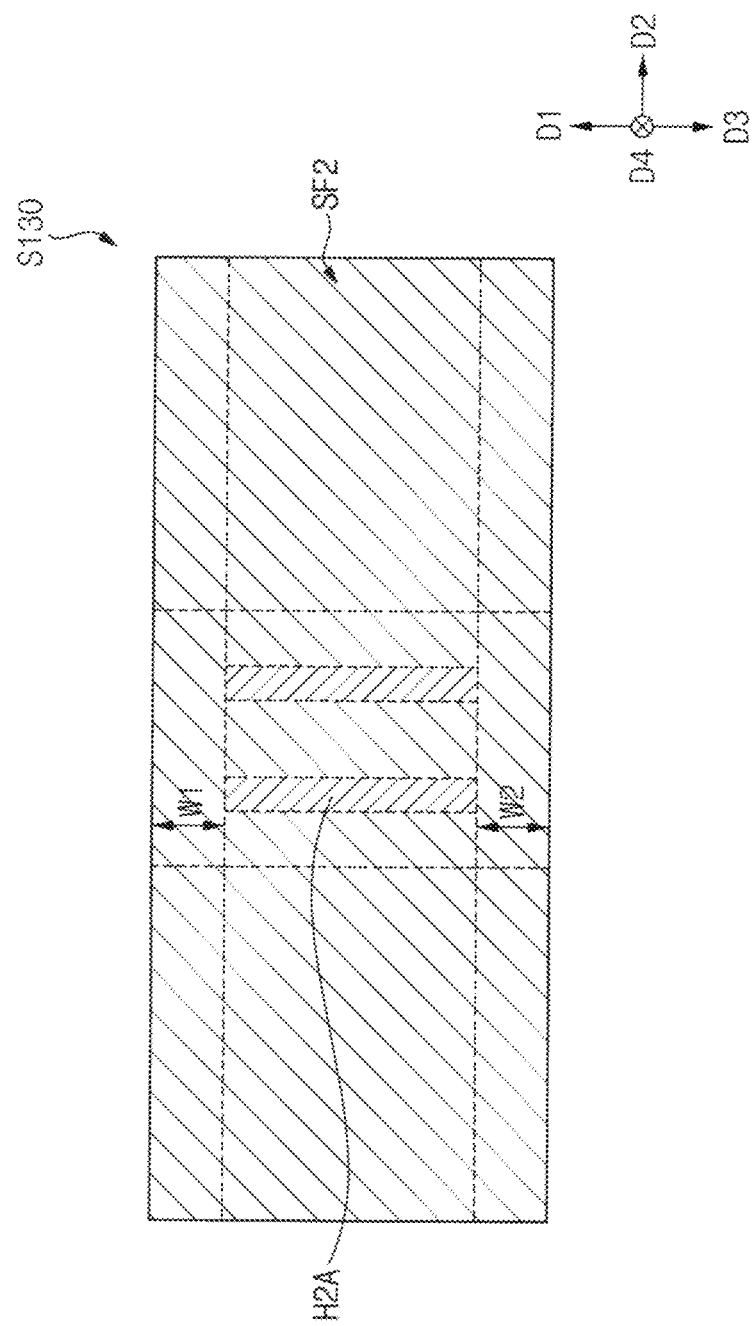
FIG. 7 is a rear view illustrating a third operation included in the method of FIG. 2.

FIG. 6 is a perspective view illustrating a third operation included in the method of FIG. 2. FIG. 7 is a rear view illustrating a third operation included in the method of FIG. 2.

Referring to FIGS. 6 and 7, the laser LB may be irradiated to a second hole area H2A of the base layer 100 (S130).

In an embodiment, the second hole area H2A may be defined in the second surface SF2 and may be an area in which the second grooves H2 are defined. In addition, the second hole area H2A may be an area including opposite sides spaced apart from opposite sides of the second surface SF2 respectively by the first width W1 and the second width W2 in the SF1 in the predetermined direction, e.g., the first direction D1 and/or the third direction D3. In addition, the second hole area H2A may be alternately arranged with the first hole area H1A.

In other words, the laser LB may be transmitted in the predetermined direction, e.g., the first direction D1 and/or the third direction D3 and may be irradiated to the second surface SF2 except for the first width W1 and the second width W2. As the laser LB is irradiated to the second hole area H2A, the second hole area H2A may have an etch selectivity different from an etch selectivity of an area to which the laser LB is not irradiated.

Figure 8:
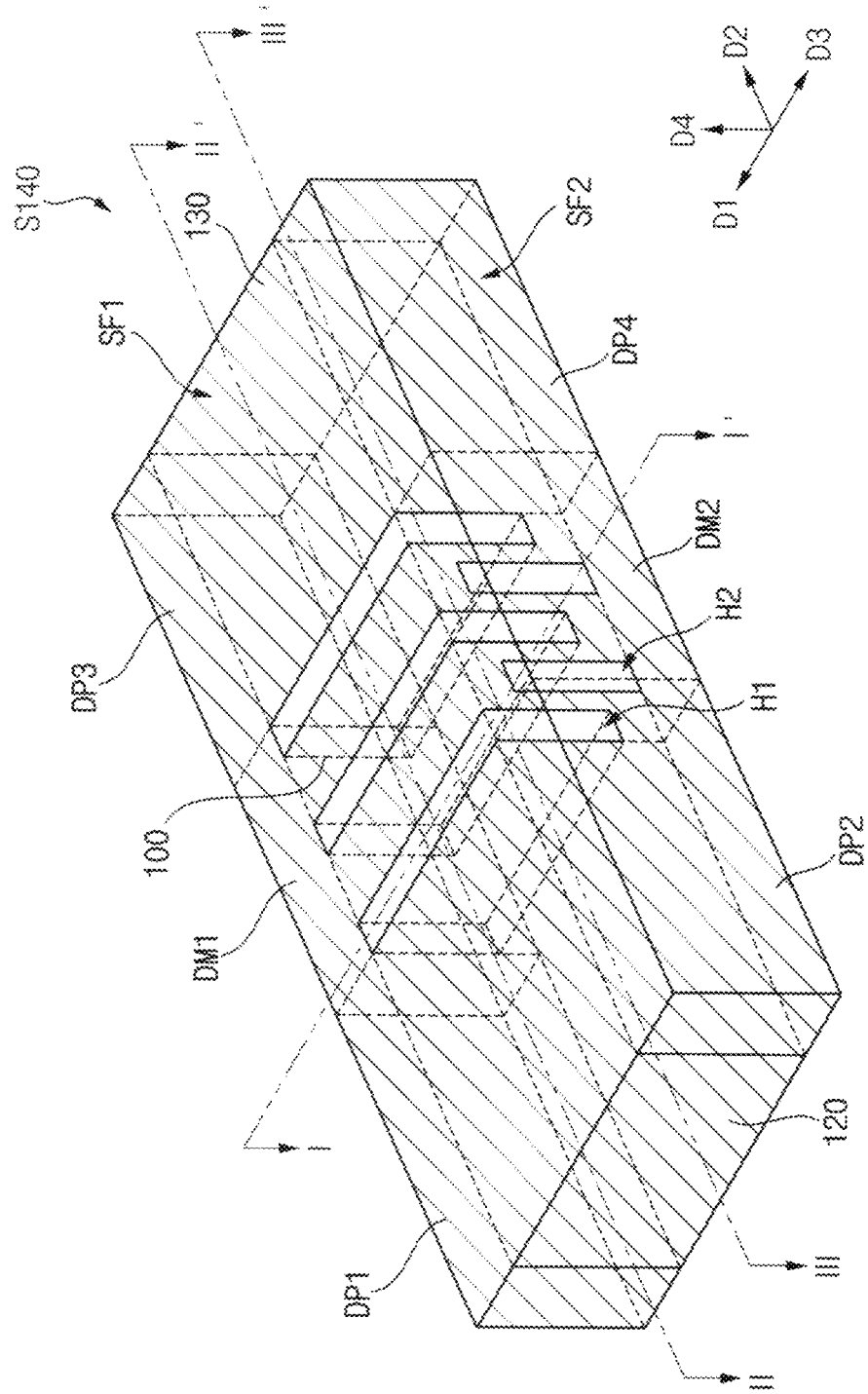
FIG. 8 is a perspective view illustrating a fourth operation included in the method of FIG. 2.
Figure 9:
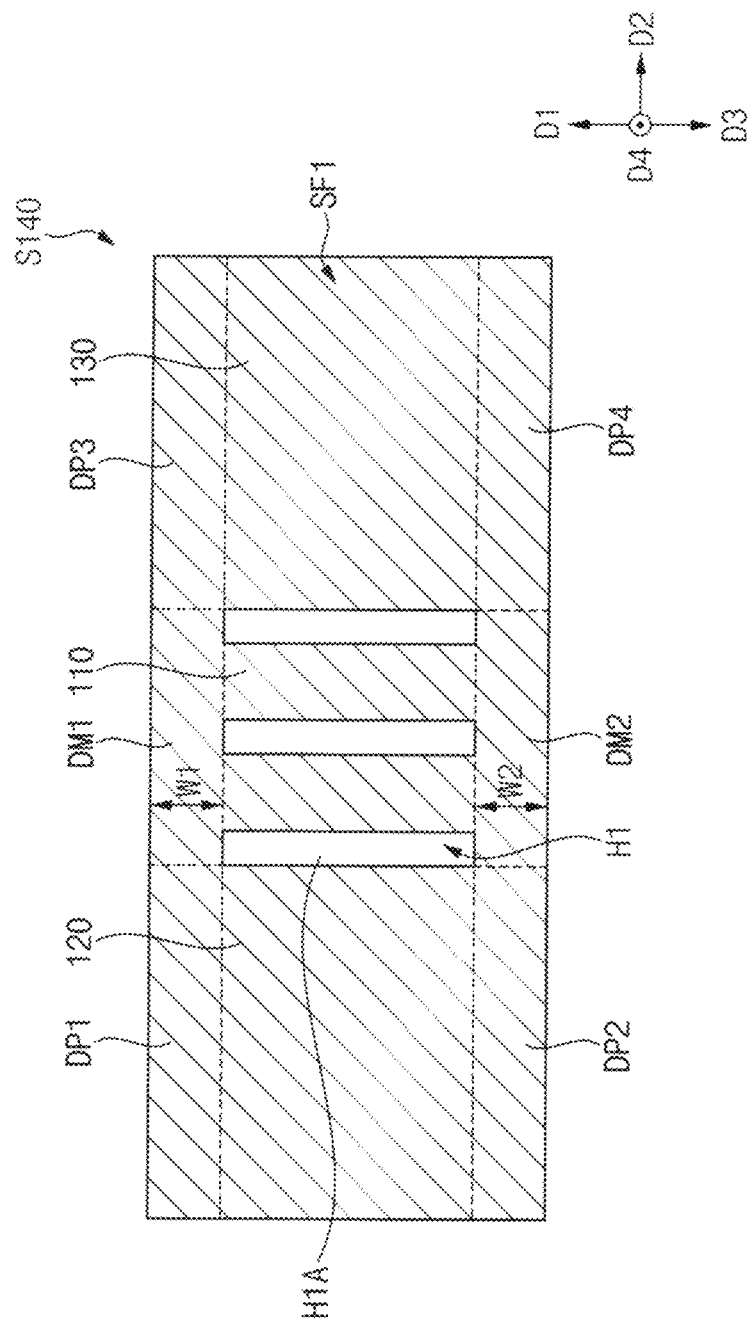
FIG. 9 is a plan view illustrating a fourth operation included in the method of FIG. 2.

FIG. 8 is a perspective view illustrating a fourth operation included in the method of FIG. 2. FIG. 9 is a plan view illustrating a fourth operation included in the method of FIG. 2.

Referring to FIGS. 8 and 9, the base layer 100 may be etched. Accordingly, the first grooves H1 and the second grooves H2 are defined, and the first dam structure DM1 and the second dam structure DM2 may be formed or provided (S140).

The base layer 100 may be reacted with an etchant. In this case, various processes enabling the base layer 100 to contact the etchant may be used. In an embodiment, the base layer 100 may be immersed in the etchant, or the etchant may be sprayed onto the base layer 100, for example.

As described above, each of the first hole area H1A and the second hole area H2A may have an etch selectivity different from an etch selectivity of an area to which the laser LB is not irradiated. Accordingly, the first hole area H1A and the second hole area H2A may react with the etchant and the base layer 100 overlapping the first hole area H1A and the second hole area H2A may be etched. Accordingly, the first grooves H1 and the second grooves H2 may be defined.

In addition, the base layer 100 corresponding to the first width W1 and the second width W2 to which the laser LB is not irradiated may not be etched. In other words, the base layer 100 adjacent to the first grooves H1 and the second grooves H2 in the first direction D1 may remain. Accordingly, the first dam structure DM1 may be formed or provided.

The first dam structure DM1 may have the first width W1 in the first direction D1. In addition, the first dam structure DM1 may be adjacent to the first grooves H1 and the second grooves H2 in the first direction D1.

In addition, the base layer 100 adjacent to the first grooves H1 and the second grooves H2 in the third direction D3 may remain. Accordingly, the second dam structure DM2 may be formed or provided.

The second dam structure DM2 may have the second width W2 in the third direction D3. In addition, the second dam structure DM2 may be adjacent to the first grooves H1 and the second grooves H2 in the third direction D3. In other words, the second dam structure DM2 may face the first dam structure DM1 with the first grooves H1 and the second grooves H2 interposed therebetween.

Figure 10:
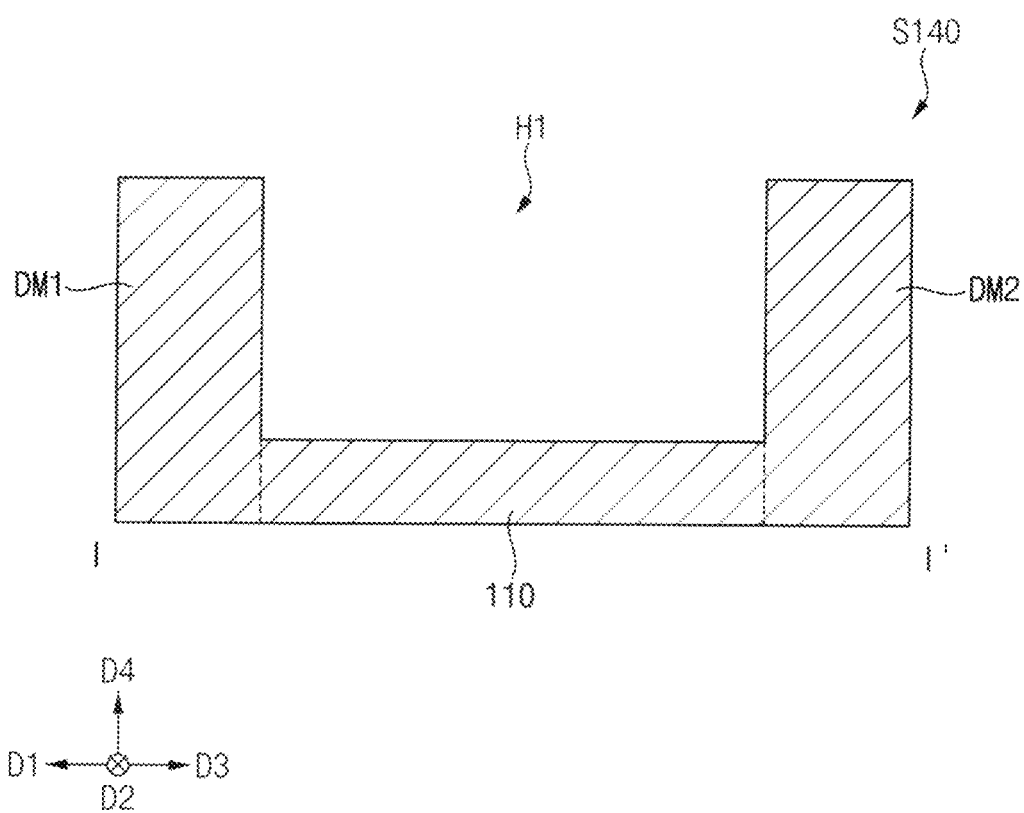
FIGS. 10, 11, and 12 are cross-sectional views illustrating a fourth operation included in the method of FIG. 2.
Figure 11:
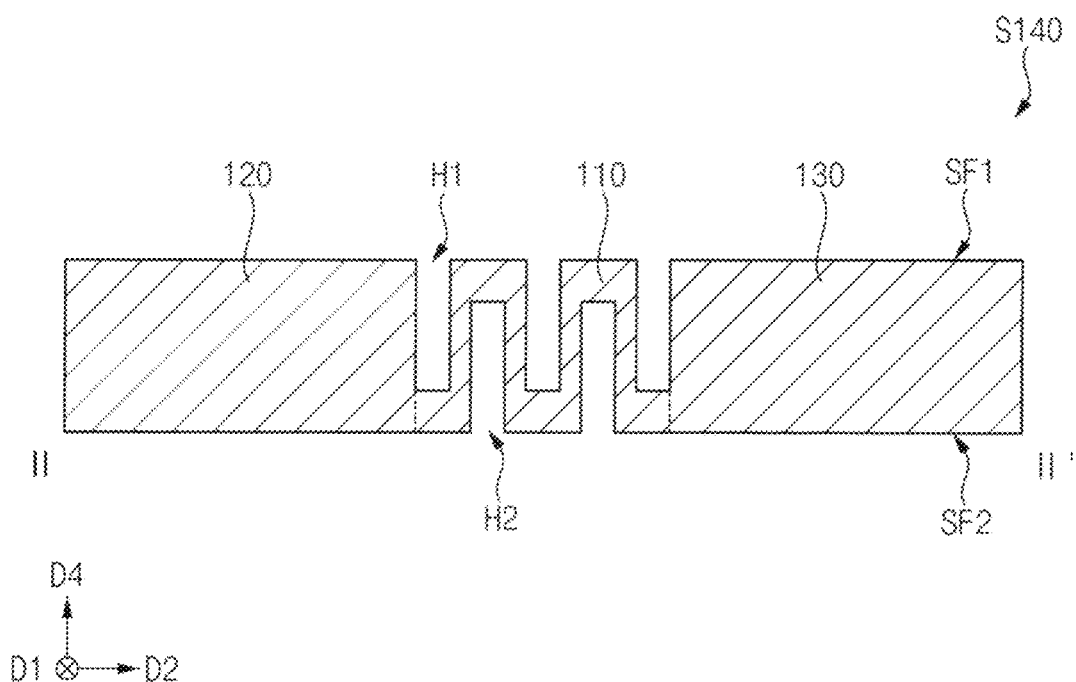
Figure 12:
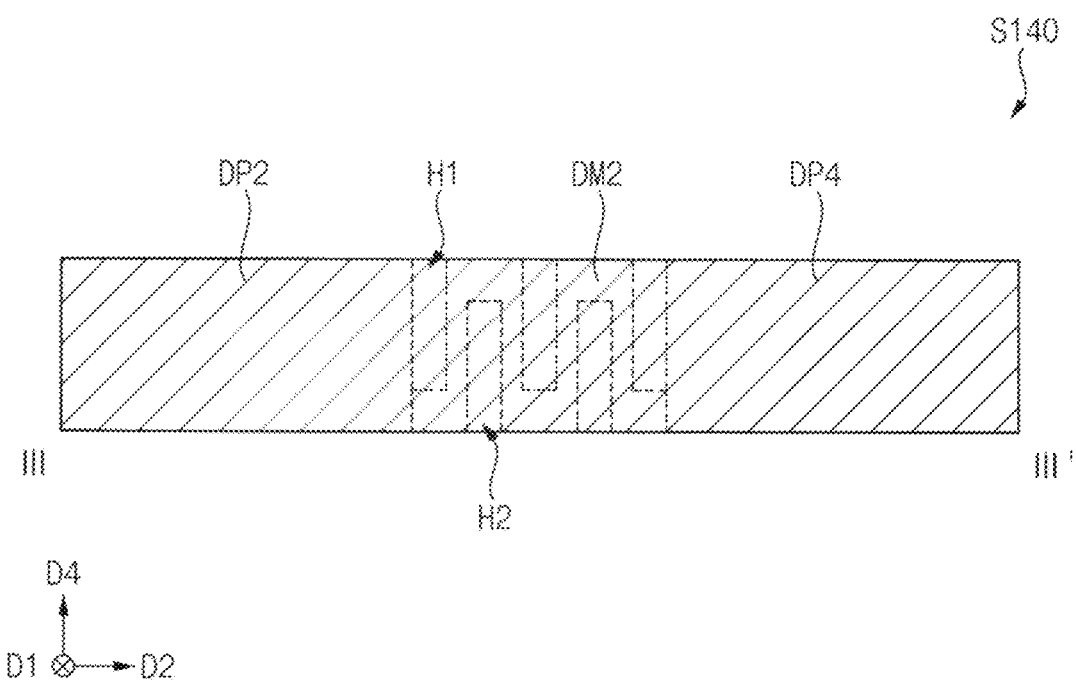

FIGS. 10, 11, and 12 are cross-sectional views illustrating a fourth operation included in the method of FIG. 2. FIG. 10 is a cross-sectional view taken along line I-I' of FIG. 8, FIG. 11 is a cross-sectional view taken along line II-II' of FIG. 8, and FIG. 12 is a cross-sectional view taken along line III-III' of FIG. 8

Referring to FIG. 10, as the first grooves H1, the first dam structure DM1, and the second dam structure DM2 are formed or provided, an accommodating space may be defined in a first cross-section of the folding portion 110.

Referring to FIG. 11, as the first grooves H1 are defined in the first surface SF1 and the second grooves H2 are defined in the second surface SF2, the folding portion 110 may have a concave-convex shape defined in a second cross-section.

Referring to FIG. 12, as the second dam structure DM2 is disposed, the first grooves H1 and the second grooves H2 may not be exposed in a third cross-section of the folding portion 110.

FIG. 13 is a perspective view illustrating a fifth operation included in the method of FIG. 2.

Referring to FIG. 13, the filler FLR may be filled in the first grooves H1 and the second grooves H2. Accordingly, a member 100M for the window module may be formed or provided (S150).

In an embodiment, the member 100M for the window module may include the folding portion 110, the first flat portion 120, the second flat portion 130, the first dam structure DM1, the second dam structure DM2, the filler FLR, a first dummy portion DP1, a second dummy portion DP2, a third dummy portion DP3, and a fourth dummy portion DP4.

The filler FLR may be filled in various ways. In an embodiment, the filler FLR may be filled through an inkjet process. In another embodiment, the filler FLR may be filled through a slot coating process. In another embodiment, the filler FLR may be filled through a squeezing process. However, the process of filling the filler FLR is not limited thereto.

The first flat portion 120 may define an inner surface of one of the first grooves H1. For example, the first flat portion 120 may contact one of the first grooves H1. The first dummy portion DP1 may be adjacent to the first flat portion 120 in the first direction D1. The second dummy portion DP2 may be adjacent to the first flat portion 120 in the third direction D3.

The second flat portion 130 may define an inner surface of one of the first grooves H1. For example, the second flat portion 130 may contact one of the first grooves H1. The third dummy portion DP3 may be adjacent to the second flat portion 130 in the first direction D1. The fourth dummy portion DP4 may be adjacent to the second flat portion 130 in the third direction D3.

FIGS. 14 and 15 are cross-sectional views illustrating a fifth operation included in the method of FIG. 2. FIG. 14 is a cross-sectional view taken along line IV-IV' of FIG. 13, and FIG. 15 is a cross-sectional view taken along line V-V' of FIG. 13.

Referring to FIG. 14, the filler FLR may be filled in the first grooves H1. As the first dam structure DM1 and the second dam structure DM2 are disposed, the filler FLR may not leak in the first direction D1 and/or the third direction D3. As the filler FLR does not leak, the filler FLR may be completely filled in the accommodation space. In other words, an unfilled space may not occur in the accommodation space. Thereafter, the filler FLR may be cured while being completely filled in the accommodation space.

Referring to FIG. 15, the filler FLR may be filled in an empty space of the concavo-convex shape. As described above, the filler FLR may be a resin having a small modulus. Accordingly, the folding portion 110 may be smoothly folded. In addition, the filler FLR may have the same refractive index as a refractive index of the base layer 100. Accordingly, the display quality of the folding unit 110 may be improved.

Figure 16:
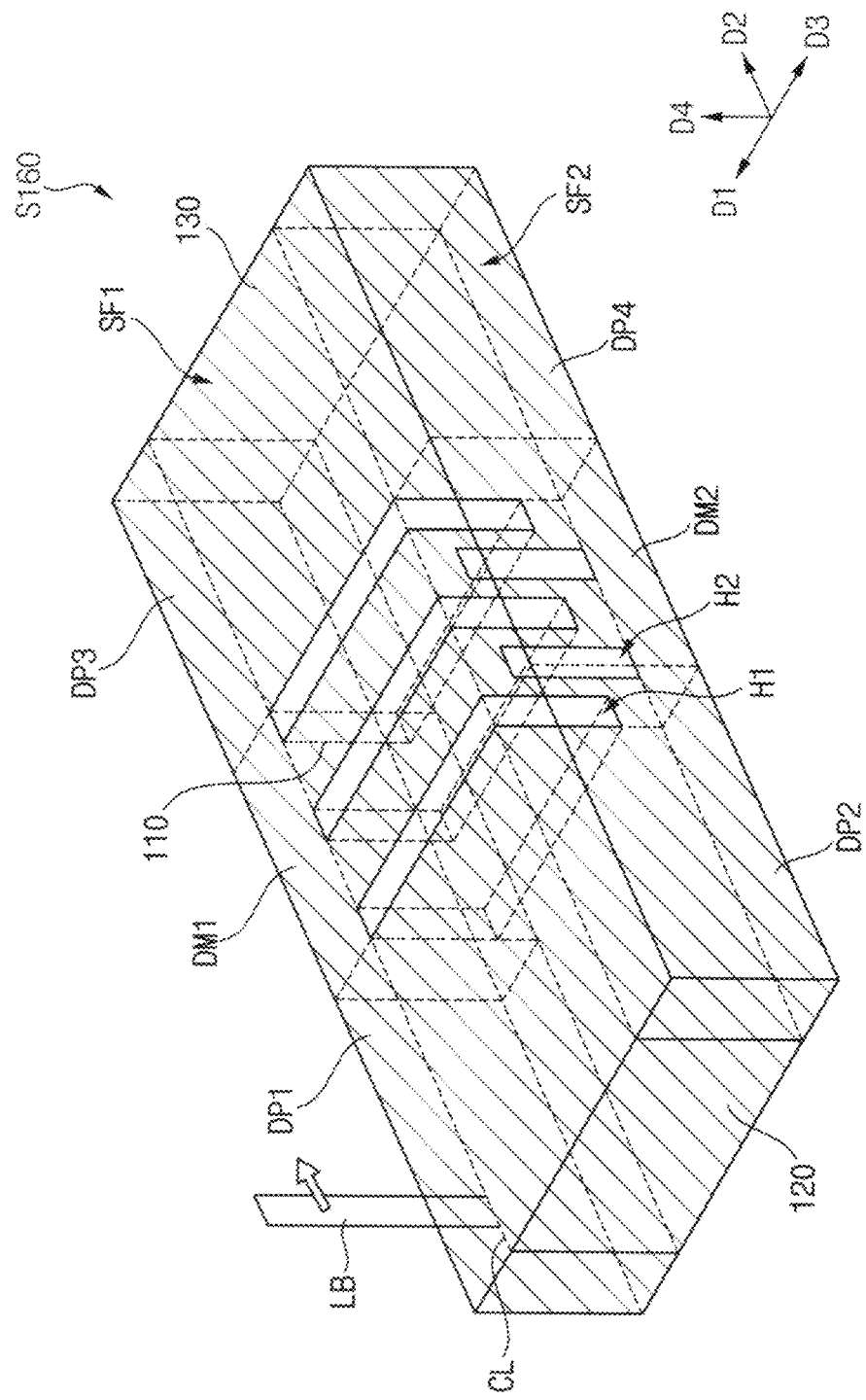
FIG. 16 is a perspective view illustrating a sixth operation included in the method of FIG. 2.

FIG. 16 is a perspective view illustrating a sixth operation included in the method of FIG. 2.

Referring to FIG. 16, the laser LB may be irradiated to a cutting line CL (S160).

In an embodiment, the cutting line CL may be a line including a boundary between the first grooves H1 and the first dam structure DM1, a boundary between the first flat portion 120 and the first dummy portion DP1, and a boundary between the second flat portion 130 and the third dummy portion DP3. The laser LB may be transmitted in the second direction D2. As the laser LB is irradiated to the cutting line CL, the cutting line CL may have an etch selectivity different from an etch selectivity of an area to which the laser LB is not irradiated.

In addition, a laser LB may be irradiated to a boundary between the first grooves H1 and the second dam structure DM2, a boundary between the first flat portion 120 and the second dummy portion DP2, and a boundary between the second flat portion 130 and the fourth dummy portion DP4.

However, the process of irradiating the laser LB to the cutting line CL may be omitted in the method S100.

Figure 17:
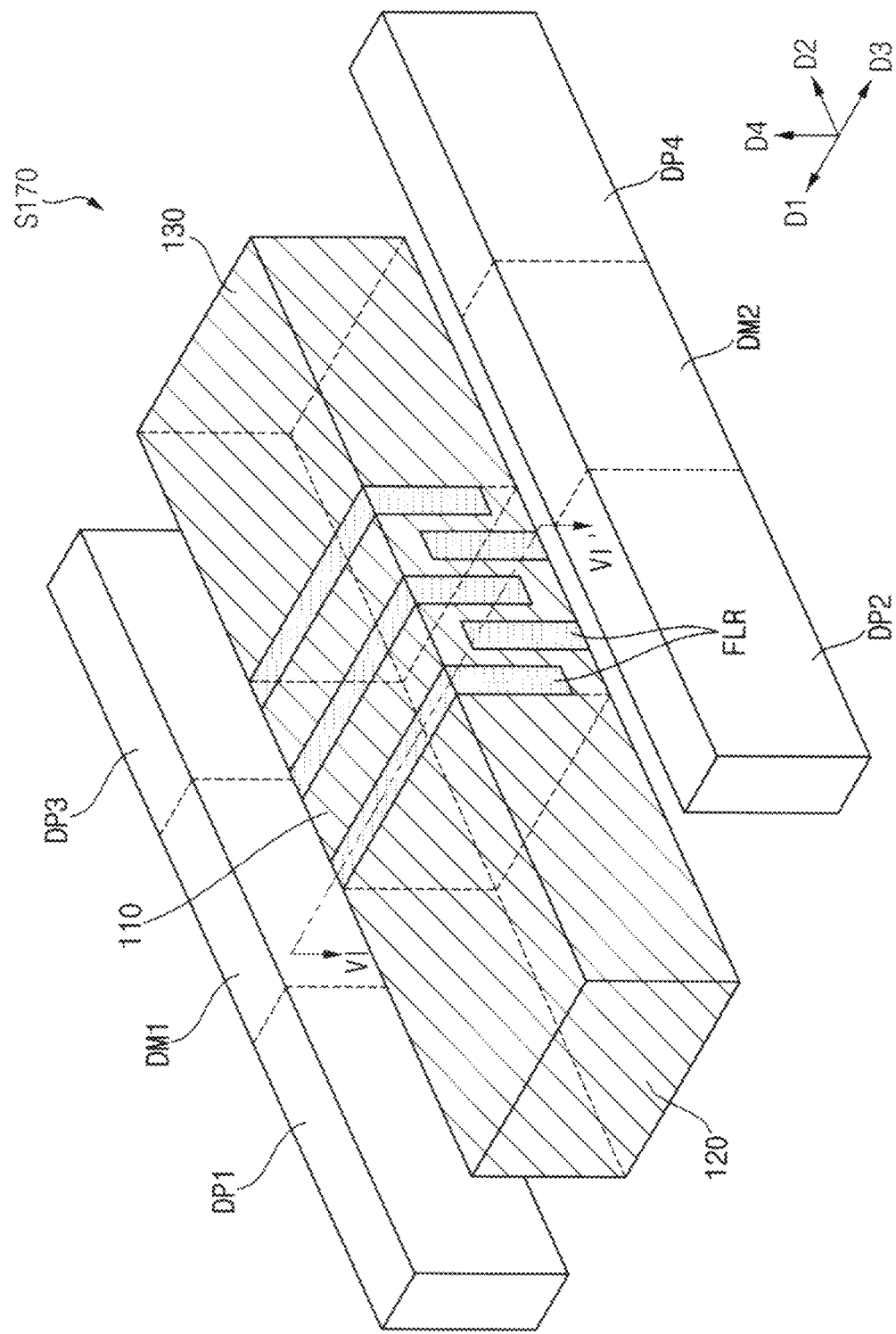
FIG. 17 is a perspective view illustrating a seventh operation included in the method of FIG. 2.
Figure 18:
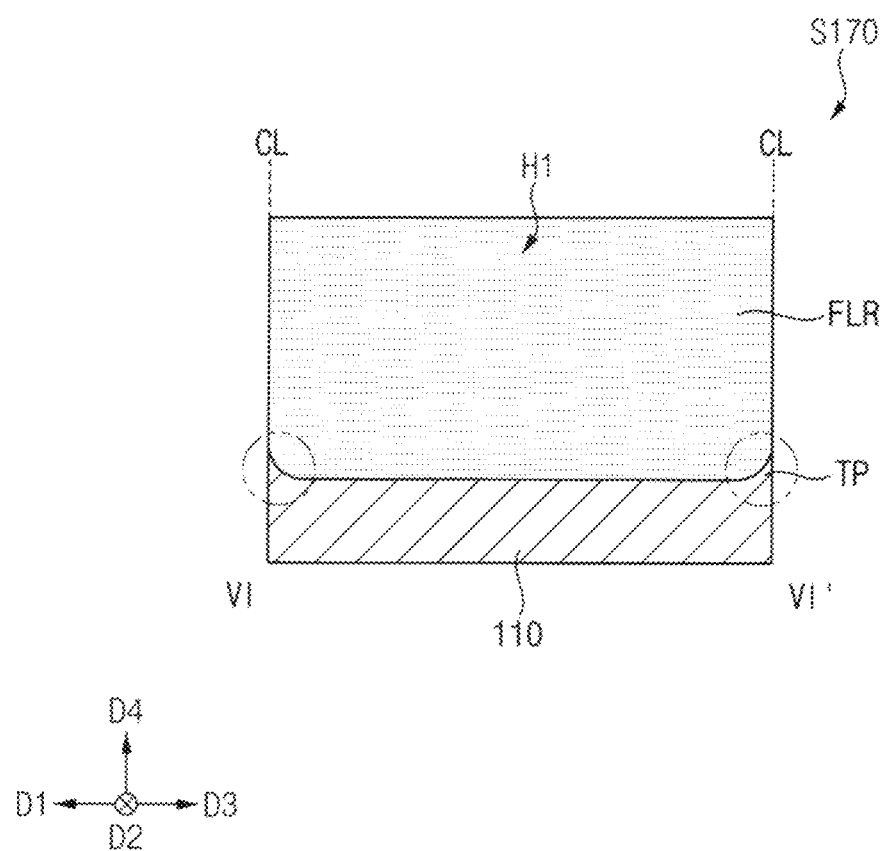
FIG. 18 is a cross-sectional view illustrating a seventh operation included in the method of FIG. 2.

FIG. 17 is a perspective view illustrating a seventh operation included in the method of FIG. 2. FIG. 18 is a cross-sectional view illustrating a seventh operation included in the method of FIG. 2. FIG. 18 is a cross-sectional view taken along line VI-VI' of FIG. 17.

Referring to FIG. 17, the base layer 100 may be etched. Accordingly, the first dam structure DM1, the second dam structure DM2, the first dummy portion DP1, the second dummy portion DP2, the third dummy portion DP3, and the fourth dummy portion DP4 may be removed (S170).

In an embodiment, the base layer 100 may be reacted with an etchant. In this case, various processes enabling the base layer 100 to contact the etchant may be used. In an embodiment, the base layer 100 may be immersed in the etchant, or the etchant may be sprayed onto the base layer 100, for example.

As described above, the cutting line CL may have an etch selectivity different from an etch selectivity of an area to which the laser LB is not irradiated. Accordingly, the cutting line CL may react with the etchant, and the base layer 100 may be etched along the cutting line CL. Therefore, the first dam structure DM1, the second dam structure DM2, the first dummy portion DP1, the second dummy portion DP2, the third dummy portion DP3, the third dummy portion DP3, and the fourth dummy portion DP4 may be removed.

Accordingly, the window module WM including the folding portion 110, the first flat portion 120, the second flat portion 130, and the filler FLR may be manufactured.

Referring to FIG. 18, as the base layer 100 is etched, a tip TP may be formed or provided on the folding portion 110 along the cutting line CL. The tip TP may have a shape protruding toward the filler FLR.

Figure 19:
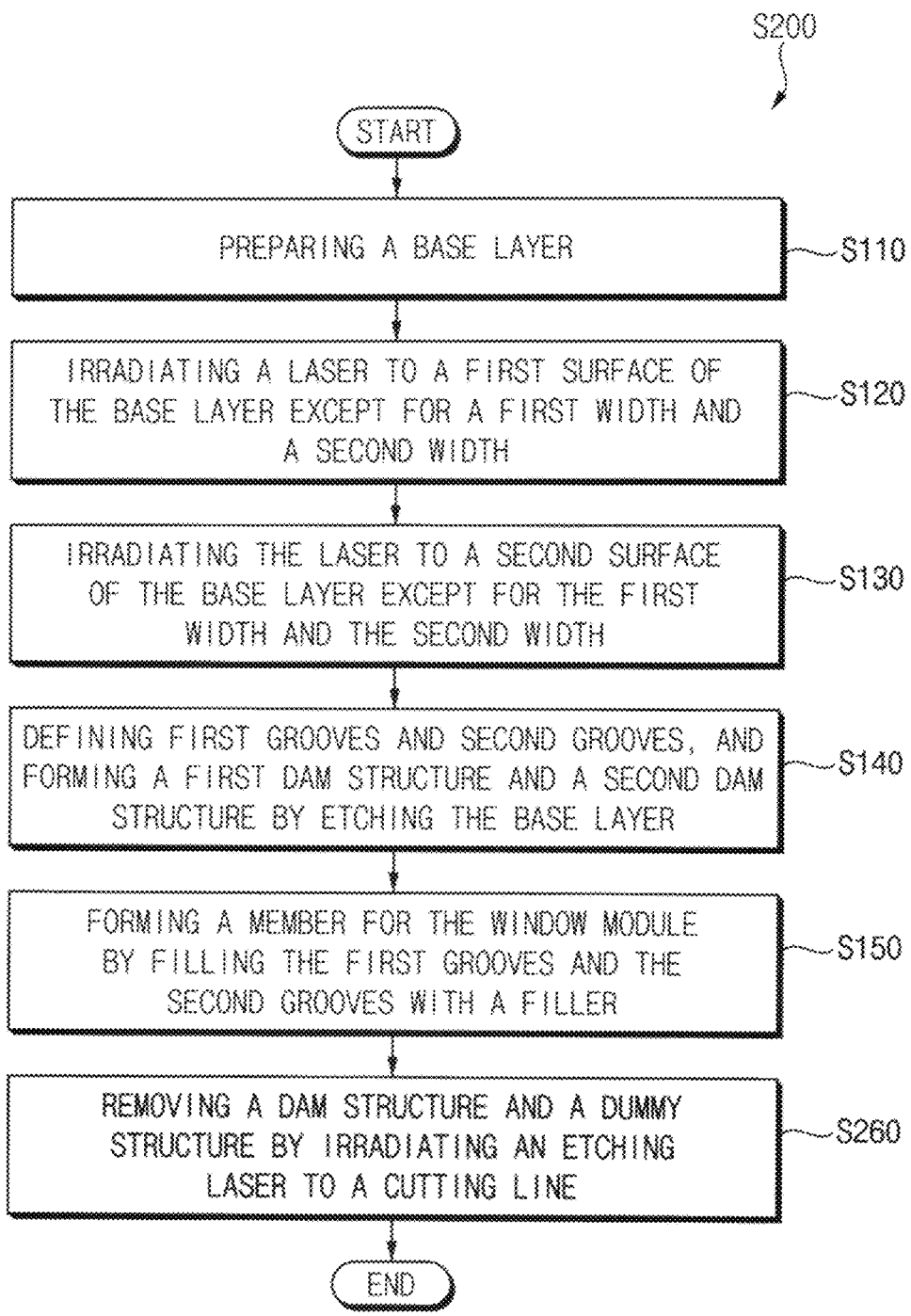
FIG. 19 is a flowchart illustrating another embodiment of a method of manufacturing the window module of FIG. 1.

FIG. 19 is a flowchart illustrating another embodiment of a method of manufacturing the window module of FIG. 1.

Referring to FIG. 19, another embodiment of the method S200 of manufacturing the window module WM may include first to sixth operations S110, S120, S130, S140, S150, and S260. The first to fifth operations S110, S120, S130, S140, and S150 may be substantially the same as the first to fifth operations S110, S120, S130, S140, and S150 described with reference to FIG. 2.

Figure 20:
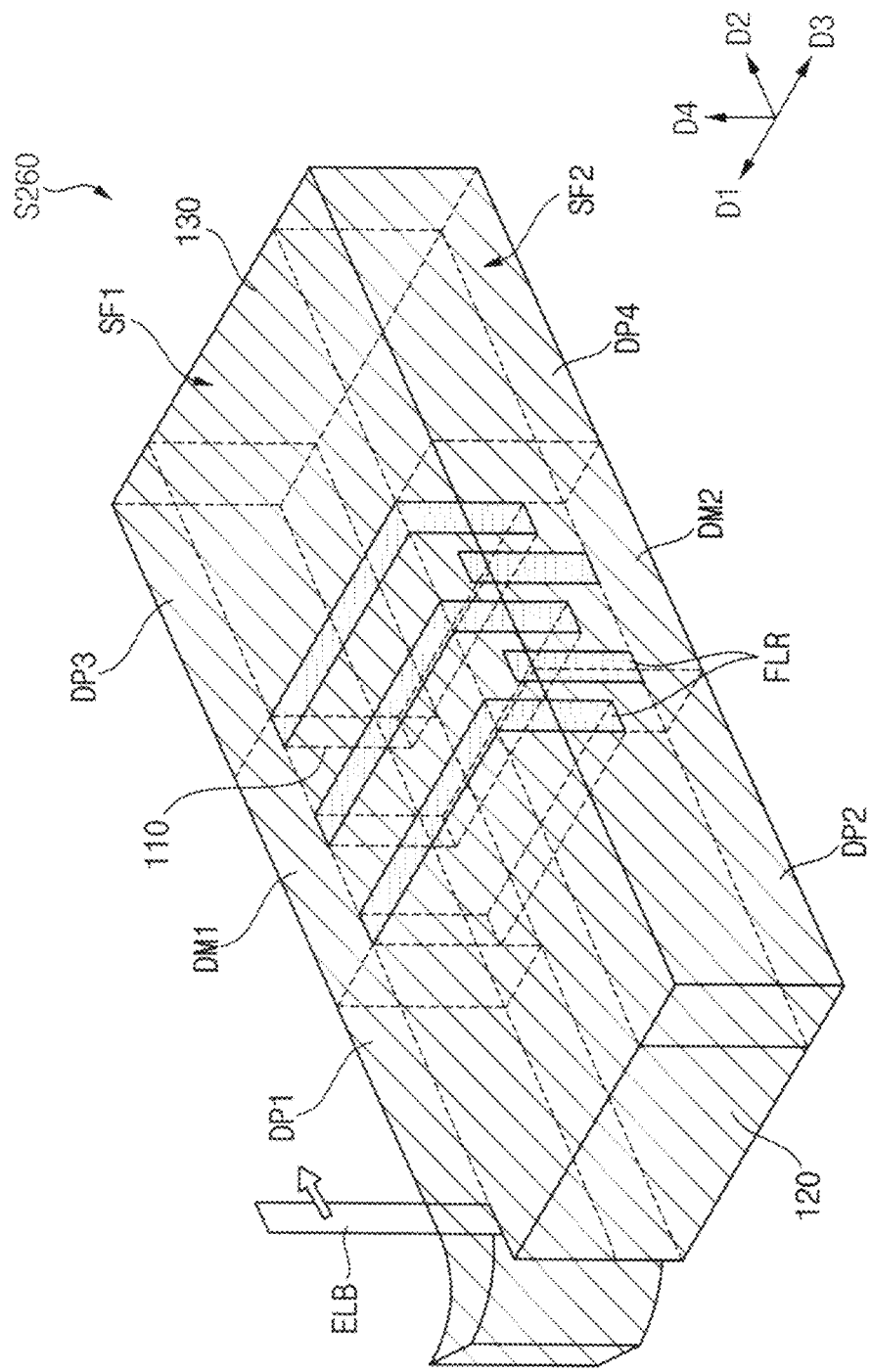
FIG. 20 is a perspective view illustrating a sixth operation included in the method of FIG. 19.

FIG. 20 is a perspective view illustrating a sixth operation included in the method of FIG. 19.

Referring to FIG. 20, as an etching intense light, e.g., an etching laser ELB, is irradiated to the cutting line CL, the first dam structure DM1, the second dam structure DM2, the first dummy portion DP1, the second dummy portion DP2, the third dummy portion DP3, and the fourth dummy portion DP4 may be removed (S260). The etching laser ELB may directly remove the base layer 100. Accordingly, in the manufacturing method S200, an etching process using an etchant may not be desired.

Figure 21:
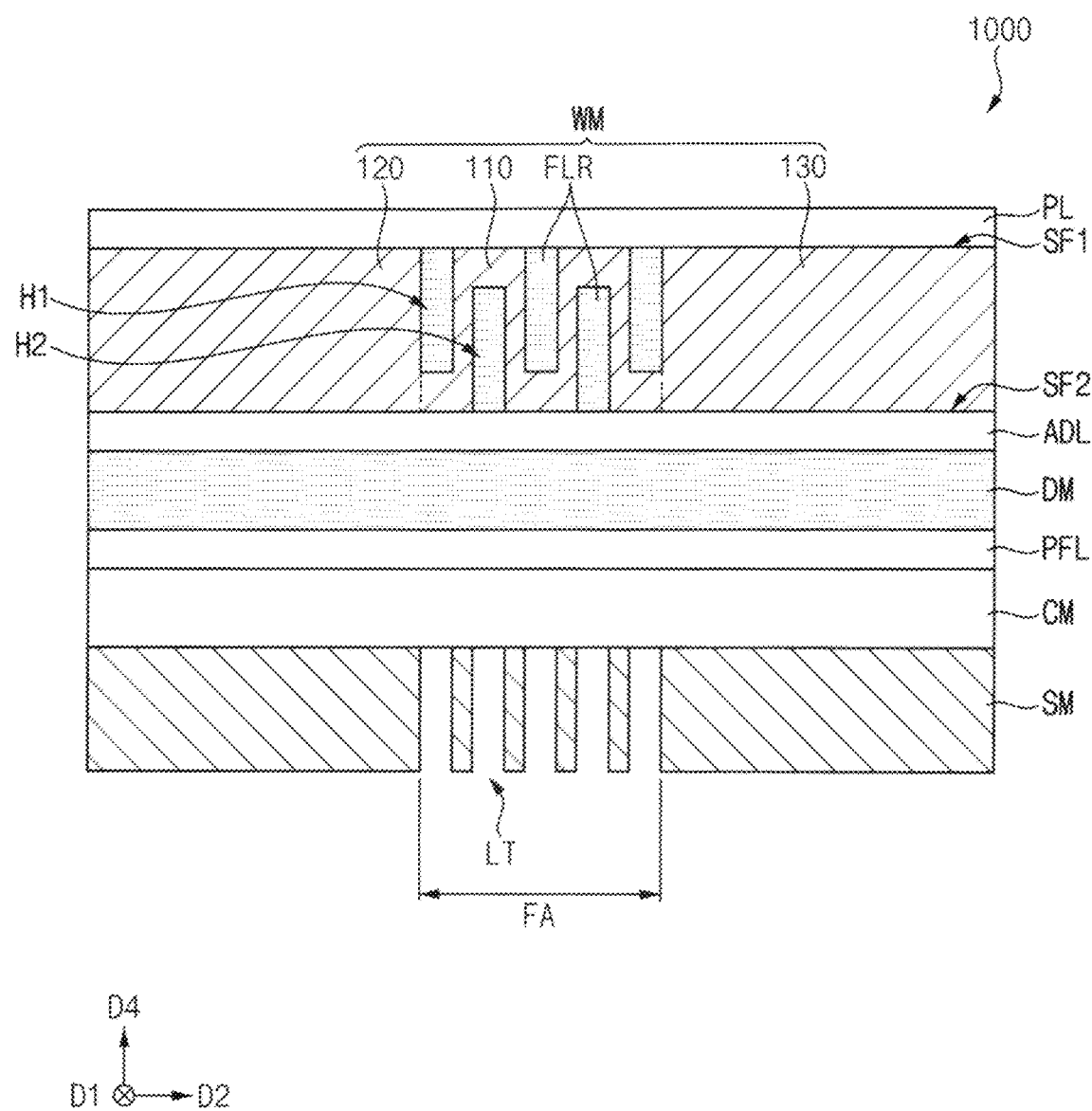
FIG. 21 is a cross-sectional view illustrating a display device including the window module of FIG. 1.
Figure 22:
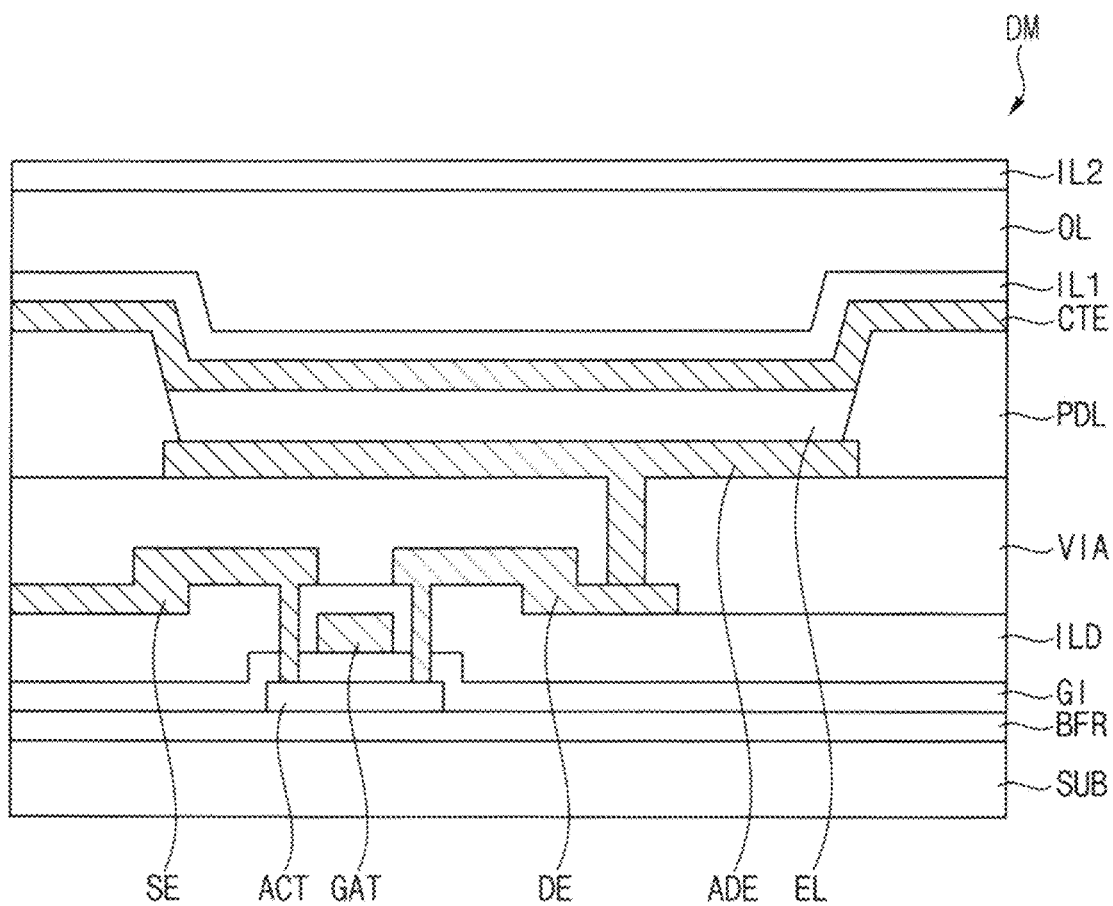
FIG. 22 is a cross-sectional view illustrating a display module included in the display device of FIG. 21.

FIG. 21 is a cross-sectional view illustrating a display device including the window module of FIG. 1. FIG. 22 is a cross-sectional view illustrating a display module included in the display device of FIG. 21.

Referring to FIG. 21, a display device 1000 including the window module WM may include a support module SM, a cushion member CM, a protective film PFL, a display module DM, an adhesive layer ADL, the window module WM, and a protective layer PL. The display device 1000 may be folded in a folding area FA.

The support module SM may be disposed under the display module DM. The support module SM may include metal, and may support the display module DM. In an embodiment, the support module SM may include at least one of invar, which is an alloy of nickel (Ni) and iron (Fe), stainless steel ("SUS"), titanium (Ti), and copper (Cu), for example. These may be used alone or in combination with each other.

A lattice LT may be formed or provided on the support module SM. In an embodiment, the lattice LT may overlap the folding portion 110. As the lattice LT passes through the support module SM, the support module SM may be smoothly folded in the folding area FA.

The cushion member CM may be disposed between the support module SM and the display module DM. The cushion member CM may buffer an external shock which is applied to the display module DM and may protect the display module DM. In an embodiment, the cushion member CM may include a material capable of buffering by including air, such as a cushion or a sponge. In addition, in order to facilitate folding and unfolding of the display module DM, the cushion member CM may include a flexible material. In an embodiment, the cushion member CM may include polyacrylates resin, polyurethane, thermoplastic polyurethane ("TPU"), latex, polyurethane foam, polystyrene foam, or the like, for example. These may be used alone or in combination with each other.

The protective film PFL may be disposed between the cushion member CM and the display module DM. The protective film PFL may prevent penetration of moisture and oxygen from the outside and may absorb external impact. In order to realize a flexible display device, the display module DM may include a flexible plastic substrate, and the protective film PFL may support the flexible plastic substrate.

In an embodiment, the protective film PFL may be a plastic film, for example. In an embodiment, the protective film PFL may include polyethersulfone ("PS"), polyacrylate ("PAR"), polyetherimide ("PEI"), polyethylenenaphthalate ("PEN"), polyphenylene sulfide ("PPS"), polyarylate ("PA"), polycarbonate ("PC"), poly(arylene ethersulfone), polyethylene terephthalate ("PET"), polyimide ("PI") or the like, for example. These may be used alone or in combination with each other.

The display module DM may be disposed between the protective film PFL and the window module WM. An image may be displayed on the display module DM. A detailed structure of the display module DM will be described with reference to FIG. 22.

The adhesive layer ADL may be disposed on the display module DM. The adhesive layer ADL may adhere the window module WM to the display module DM. In an embodiment, the adhesive layer ADL may include a pressure sensitive adhesive ("PSA"), an optically clear adhesive ("OCA"), an optically clear resin ("OCR"), or the like. These may be used alone or in combination with each other.

The window module WM may be disposed on the adhesive layer ADL. In an embodiment, the second surface SF2 may contact the adhesive layer ADL, and the first surface SF1 may face the front of the display device 1000. In addition, the first grooves H1 and the second grooves H2 may overlap the folding area FA, and the filler FLR may be disposed in the first grooves H1 and the second grooves H2.

The window module WM may buffer an external shock that may be applied to the display module DM, and may protect the display module DM. In addition, as the filler FLR has a low modulus, the window module WM may be smoothly folded in the folding area FA. In addition, as a refractive index of the filler FLR is the same as a refractive index of the folding portion 110, the display quality of the folding portion 110 may be improved.

In addition, as described above, as the window module member 100M includes the first and second dam structures DM1 and DM2, the filler FLR may be completely filled in the accommodation space. In other words, an unfilled space may not occur in the first grooves H1 and the second grooves H2. Accordingly, the display quality of the folding portion 110 may be improved.

The protective layer PL may be disposed on the window module WM. The protective layer PL may be a plastic film. In an embodiment, the protective layer PL may include PS, PAR, PEI, PEN, PPS, PA, PC, poly(arylene ethersulfone), PET, PI, or the like, for example. These may be used alone or in combination with each other. The protective layer PL may prevent a foreign body feeling caused by the filler FLR and may improve the impact resistance of the window module WM.

Referring to FIG. 22, the display module DM may include a substrate SUB, a buffer layer BFR, an active pattern ACT, a gate insulating layer GI, a gate electrode GAT, an inter-insulating layer ILD, a source electrode SE, a drain electrode DE, a via-insulating layer VIA, a first electrode ADE, a pixel defining layer PDL, an emission layer EL, a second electrode CTE, a first inorganic layer IL1, an organic layer OL, and a second inorganic layer IL2.

The substrate SUB may include a transparent or opaque material. In an embodiment, embodiments of the material that may be used as the substrate SUB may be glass, quartz, plastic, or the like. These may be used alone or in combination with each other. In addition, the substrate SUB may be configured as a single layer or as a multi-layer in combination with each other.

The buffer layer BFR may be disposed on the substrate SUB. The buffer layer BFR may prevent metal atoms, atoms, or impurities from diffusing from the substrate SUB into the active pattern ACT. In addition, the buffer layer BFR may control a heat supply rate during a crystallization process for forming the active pattern ACT.

The active pattern ACT may be disposed on the buffer layer BFR. The active pattern ACT may include a silicon semiconductor material or an oxide semiconductor material. In embodiments, the silicon semiconductor material that may be used as the active pattern ACT may include amorphous silicon, polycrystalline silicon, or the like. In embodiments, the oxide semiconductor material that may be used as the active pattern ACT may include indium gallium zinc oxide ("IGZO") (InGaZnO), indium tin zinc oxide ("ITZO") (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The gate insulating layer GI may be disposed on the active pattern ACT and may cover the active pattern ACT. In an embodiment, the gate insulating layer GI may include an insulating material. In embodiments, the insulating material that may be used as the gate insulating layer GI may include silicon oxide, silicon nitride, silicon oxynitride, or the like. These may be used alone or in combination with each other.

The gate electrode GAT may be disposed on the gate insulating layer GI and may overlap the active pattern ACT. In an embodiment, the gate electrode GAT may include a metal, an alloy, a conductive metal oxide, a transparent conductive material, or the like. In embodiments, the material that may be used as the gate electrode GAT may include silver ("Ag"), an alloy including silver, molybdenum ("Mo"), an alloy including molybdenum, aluminum ("Al"), an alloy including aluminum, aluminum nitride ("AN"), tungsten ("W"), tungsten nitride ("WN"), copper ("Cu"), nickel ("Ni"), chromium ("Cr"), tantalum ("Ta"), platinum ("Pt"), scandium ("Sc"), indium tin oxide ("ITO"), indium zinc oxide ("IZO"), or the like. These may be used alone or in combination with each other. In addition, the gate electrode GAT may be configured as a single layer or as a multilayer in combination with each other.

The inter-insulating layer ILD may be disposed on the gate electrode GAT and may cover the gate electrode GAT. In an embodiment, the inter-insulating layer ILD may include an insulating material. In embodiments, the insulating material that may be used as the inter-insulating layer ILD may include silicon oxide, silicon nitride, silicon oxynitride, or the like. These may be used alone or in combination with each other. In addition, the inter-insulating layer ILD may be configured as a single layer or as a multilayer in combination with each other.

The source electrode SE and the drain electrode DE may be disposed on the inter-insulating layer ILD. Each of the source electrode SE and the drain electrode DE may contact the active pattern ACT. In an embodiment, the source electrode SE and the drain electrode DE may include a metal, an alloy, a conductive metal oxide, a transparent conductive material, or the like.

The via-insulating layer VIA may be disposed on the source electrode SE and the drain electrode DE, and may cover the source electrode SE and the drain electrode DE. The via-insulating layer VIA may include an insulating material. In embodiments, the insulating material that may be used as the via-insulating layer VIA may include photoresist, polyacrylic resin, polyimide resin, acrylic resin, or the like. These may be used alone or in combination with each other.

The first electrode ADE may be disposed on the via-insulating layer VIA. In an embodiment, the first electrode ADE may be electrically connected to the drain electrode DE. The first electrode ADE may include a metal, an alloy, a conductive metal oxide, a transparent conductive material, or the like.

The pixel defining layer PDL may be disposed on the via-insulating layer VIA, and an opening exposing the first electrode ADE may be formed or provided in the pixel defining layer PDL. The pixel defining layer PDL may include an insulating material. In embodiment, the insulating material that may be used as the pixel defining layer PDL may include photoresist, polyacrylic resin, polyimide resin, acrylic resin, or the like. These may be used alone or in combination with each other.

The emission layer EL may be disposed on the first electrode ADE. In an embodiment, the emission layer EL may be disposed in the opening, for example. The emission layer EL may generate light based on a potential difference between the first electrode ADE and the second electrode CTE.

The second electrode CTE may be disposed on the emission layer EL. The second electrode CTE may be implemented as a plate electrode, and may include a metal, an alloy, a conductive metal oxide, a transparent conductive material, or the like.

The first inorganic layer IL1 may be disposed on the second electrode CTE and may include an inorganic material. The organic layer OL may be disposed on the first inorganic layer IL1 and may include an organic material. The second inorganic layer IL2 may be disposed on the organic layer OL and may include an inorganic material. The first inorganic layer ILL the organic layer OL, and the second inorganic layer IL2 may prevent foreign substances from penetrating into the emission layer EL.

Figure 23:
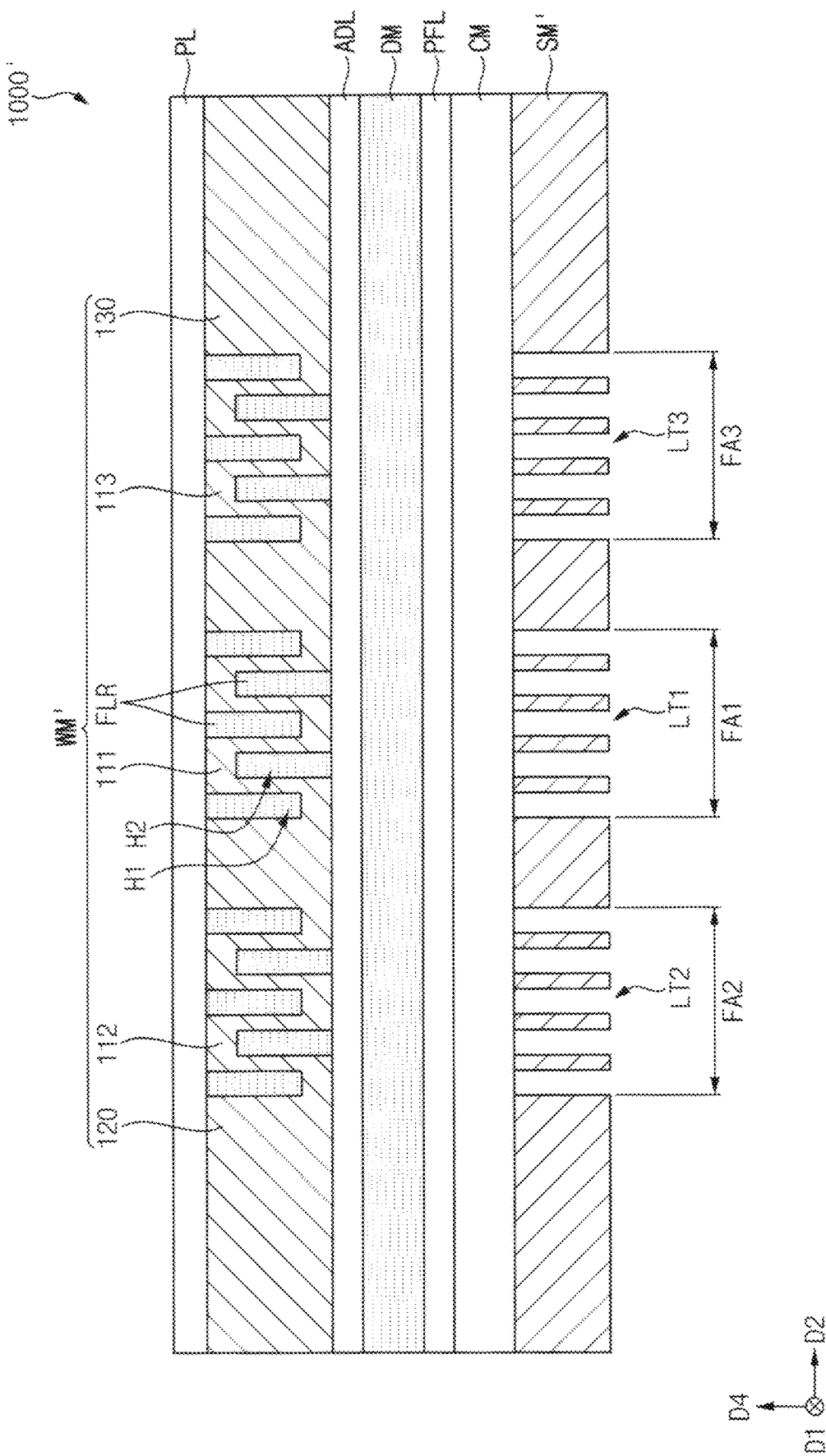
FIG. 23 is a cross-sectional view illustrating another embodiment of a display device including a window module.

FIG. 23 is a cross-sectional view illustrating another embodiment of a display device including a window module.

Referring to FIG. 23, a display device 1000' may include a support module SM', the cushion member CM, the protective film PFL, the display module DM, the adhesive layer PSA, a window module WM', and the protective layer PL. However, the cushion member CM, the protective film PFL, the display module DM, the adhesive layer PSA, the protective layer PL. However, the cushion member CM, the protective film PFL, the display module DM, the adhesive layer PSA, and the protective layer PL may be substantially the same as the cushion member CM, the protective film PFL, the display module DM, the adhesive layer PSA, and the protective layer PL described with reference to FIG. 21.

The display device 1000' may be folded in a first folding area FA1, a second folding area FA2, and a third folding area FA3. In an embodiment, the first folding area FA1 may be disposed between the second folding area FA2 and the third folding area FA3, for example. In an embodiment, the display device 1000' may be in-folded in the first folding area FA1 and may be out-folded in the second and third folding areas FA2 and FA3. However, the invention is not limited thereto, and the display device 1000' may be folded in various other ways.

A first lattice LT1, a second lattice LT2, and a third lattice LT3 may be formed or provided in the support module SM'. As the first to third lattices LT1, LT2, and LT3 pass through the supporting module SM', the supporting module SM' may be folded smoothly in the first to third folding areas FA1, FA2, and FA3.

The window module WM' may be disposed on the adhesive layer PSA. The window module WM' may include a first folding portion 111, a second folding portion 112, a third folding portion 113, a first flat portion 120, and a second flat portion 130. The first folding portion 111 may be disposed between the second folding portion 112 and the third folding portion 113. The first to third folding portions 111, 112, and 113 may be disposed between the first flat portion 120 and the second flat portion 130.

The first grooves H1 and the second grooves H2 may be defined in each of the first to third folding portions 111, 112, and 113. The filler FLR may be filled in the first grooves H1 and the second grooves H2.

Although illustrative embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A member for window module, the member comprising:
   a base layer which is foldable and in which a groove defined, the base layer comprising:
      a first dam structure defining a first inner side of the groove and an outer side of the base layer; and
      a filler filled in the groove,
   wherein the first dam structure has a predetermined width between the first inner side of the groove and the outer side of the base layer in a first direction which is a main extension direction of the groove in a plan view.

2. The member of claim 1, wherein the filler is accommodated by the groove and the first dam structure.

3. The member of claim 1, wherein the filler contacts the first dam structure.

4. The member of claim 1, wherein the groove includes a plurality of first grooves arranged in a second direction crossing the first direction, and
   wherein the first dam structure defines first inner sides of the plurality of first grooves.

5. The member of claim 4, further comprising:
   a second dam structure facing the first dam structure with the plurality of first grooves interposed therebetween.

6. The member of claim 5, wherein the second dam structure is adjacent to the plurality of first grooves in a third direction opposite to the first direction, and
   wherein the second dam structure defines second inner sides of the plurality of first grooves opposite to the first inner sides of the plurality of first grooves.

7. The member of claim 4, wherein the groove further includes a plurality of second grooves alternately arranged with the plurality of first grooves and arranged in the second direction,
   wherein the plurality of first grooves is defined in a first surface of the base layer, and
   wherein the plurality of second grooves is defined in a second surface opposite to the first surface of the base layer.

8. The member of claim 7, wherein the first dam structure further defines inner sides of the plurality of second grooves.

9. The member of claim 1, wherein the base layer further includes a flat portion defining a second inner side of the groove,
   wherein the groove extends in a first direction,
   wherein the first dam structure is adjacent to the groove in the first direction, and
   wherein the flat portion is adjacent to the groove in a second direction crossing the first direction.

10. The member of claim 9, wherein the filler is accommodated by the groove, the first dam structure, and the flat portion.

11. The member of claim 1, wherein a refractive index of the base layer equals to a refractive index of the filler.

* * * * *